(12) United States Patent
Salomon

(10) Patent No.: US 8,059,724 B2
(45) Date of Patent: Nov. 15, 2011

(54) METHOD AND SYSTEM FOR REDUCING COMMON MODE NOISE INTERFERENCE IN A DIFFERENTIAL COMMUNICATION CHANNEL

(75) Inventor: Tavi Salomon, Holon (IL)

(73) Assignee: SanDisk IL Ltd, Kfar Saba (IL)

( * ) Notice: Subject to any disclaimer, the term of this patent is extended or adjusted under 35 U.S.C. 154(b) by 876 days.

(21) Appl. No.: 12/045,761

(22) Filed: Mar. 11, 2008

(65) Prior Publication Data

US 2008/0219359 A1    Sep. 11, 2008

Related U.S. Application Data

(60) Provisional application No. 60/894,217, filed on Mar. 11, 2007.

(51) Int. Cl.
*H04B 3/00* (2006.01)

(52) U.S. Cl. ........................................ 375/257; 375/247

(58) Field of Classification Search .................. 375/257, 375/247

See application file for complete search history.

(56) References Cited

U.S. PATENT DOCUMENTS

| 4,201,958 | A | * | 5/1980 | Ahamed | 341/143 |
| 5,485,488 | A | | 1/1996 | Van Brunt et al. | |
| 5,712,875 | A | | 1/1998 | Wooten | |
| 5,978,419 | A | | 11/1999 | Cassiday et al. | |
| 6,327,308 | B1 | | 12/2001 | Wooten | |
| 2005/0259756 | A1 | * | 11/2005 | Kasahara | 375/257 |

FOREIGN PATENT DOCUMENTS

| EP | 0955750 | 11/1999 |
| WO | 92/17938 | 10/1992 |
| WO | 99/38296 | 7/1999 |

* cited by examiner

*Primary Examiner* — Shuwang Liu
*Assistant Examiner* — Michael Neff
(74) *Attorney, Agent, or Firm* — Martine Penilla Group, LLP

(57) ABSTRACT

A data transmission system and method includes providing a current to a first conductor by a current source to transmit a first binary digit while isolating a second conductor from the current source. In response to a command to transmit a second binary digit, amount of current provided by the current source to the first conductor is decreased from a maximum value to zero while simultaneously increasing the amount of current provided to the second conductor from zero to a maximum value. The increase and the decrease in the amount of current are done the same rate. A first and a second signal corresponding to the current provided to the first and the second conductors each have a transition edge with a leading section, a midsection and trailing section such that an average slope of the midsection is greater than average slope of the leading section and the average slope of the trailing section.

17 Claims, 16 Drawing Sheets

METHOD AND SYSTEM FOR REDUCING COMMON MODE NOISE INTERFERENCE IN A DIFFERENTIAL COMMUNICATION CHANNEL

REFERENCE TO EARLIER-FILED APPLICATIONS

This application claims the benefit of U.S. Provisional Patent Application No. 60/894,217, filed Mar. 11, 2007, the content of which is incorporated by reference herein in its entirety.

FIELD OF THE INVENTION

The present invention generally relates to the field of digital communication, and more specifically to a method for communicating digital data via a differential communication channel, and to a switching system that implements the digital data communication method.

BACKGROUND

In electronics, "differential communication channel" refers to transmission of data by means of two signals, which have opposite polarity, that are sent simultaneously on two separate conductors, or by means of one signal, at a time, in the same polarity, where the sign of the resulting difference between the signals existing on the two conductors is interpreted as digital value "1" or "0". Data that is sent via a differential communication channel is generally referred to as "differential digital data", and communication of differential digital data is generally referred to as "differential communication". In electronics, the term "crosstalk" refers to any phenomenon by which a signal transmitted on one circuit, channel, or wire, of a transmission system creates an undesired signal in another circuit, channel, or wire, due to undesired capacitive, inductive, or conductive coupling between them. The undesired signal is called "noise", "interference", or "disturbance." In general, the closer the circuits, channels, or wires, the more they are prone to picking up crosstalk interference.

Common Mode Interference ("CMI"), which is a type of crosstalk interference, results from similar currents flowing in the same direction in nearby wires. This kind of electric interference is hard to isolate and to mitigate by using off-the-shelf communication interfaces. In addition, efforts traditionally have been made to cope with the implications of CMI interference in the receiver rather than coping with the CMI interference in the transmitting device. CMI is referred to in certification tests known in the art as Electromagnetic Interference ("EMI") Tests. Differential Mode Interference ("DMI"), which is another type of crosstalk interference, results from incoherent electromagnetic field currents flowing in opposite directions in nearby conductive wires. This kind of electric interference can be mitigated by using twisted pair methodology. Common mode radiation and differential mode radiation are described in more detail in, for example, "High-Speed Digital System Design, A Handbook of Interconnect Theory and Design Practices" (chapter 10.2, "Physical Mechanisms of Radiation"), by STEPHEN H. HALL et al. Professional computer network cabling must pass TIA/EIA (Telecommunications Industry Association/Electronic Industries Association) standards tests, generally TIA/EIA-568-B standard, to show that the tested computer network cabling is compliant with the corresponding communication standards, protocols, etc., for which it is intended.

The Universal Bus ("USB") standard is widely used in computer peripherals, for example, for exchanging digital data. In general, high speed USB communication involves exchanging high speed (480 Mbits/Sec.) differential digital data via two electrical conductors. CMI and DMI are known to be an important cause of problems in differential communication such as USB communication, as they result in significant distortion in communicated signals.

FIG. 1 (prior art) schematically illustrates a typical differential communication link between one device, referred to as host device 20, and another device, referred to as device 22. The differential communication link is "" in the sense that digital data is communicated through it one binary digit at a time. Practically, host device 20 can both transmit and receive data to/from device 22. However, for the sake of simplicity, device 22 is shown having only a transmitter interface, and host device 20 is shown having only a receiver interface. Host device 20 may be, for example, a USB device that uses data sent to it from device 22, or a USB hub that functionally connects device 22 to other devices or routers, whether they have USB capability or not.

The differential communication link linking between host device 20 and device 22 includes a first conductor ("D+", shown at 24) and a second conductor ("D−", shown at 26), via which conductors the electric current I of current source 32 flows (but, ideally, not in both conductors simultaneously) to host device 20. A stream of binary digits "1" and "0", which constitute digital data that is conveyed from device 22 to host device 20 via conductors 24 and 26, is generated by causing the current I to flow alternately through the D+ conductor 24 and the D− conductor 26. Specifically, one of the conductors 24, 26 is assigned for transmission of binary value "1" and the other of the conductors 24, 26 is assigned for transmission of binary value "0." Selecting a specific conductor for a specific binary digit depends on the communication protocol or standard used. Transmission of binary value "1" is executed by directing the electric current I to the conductor selected for binary values "1", and transmission of binary value "0" is executed by directing the electric current I to the conductor selected for binary values "0". Whenever the binary digit that is to be transmitted changes (i.e., from "1" to "0", or from "0" to "1"), the electric current I is diverted from one conductor to the other by using switching system 102. Thus, during data communication, binary digits are transmitted via the differential communication interface one digit at a time, such that "0s" are always transmitted using one of the conductors (e.g., conductor 24) and "0s" are always transmitted using the other conductor (e.g., conductor 26).

Switching system 102 includes controllable switches 34 and 40, and logic inverter 39. Controllable switches 34 and 40 are driven by control signals 36 and 38 that are issued by a controller (not shown in FIG. 1). Control signals 36 and 38 switch controllable switches 34 and 40, respectively, between an "open" state and a "closed" state so as to redirect, or divert, the electric current I from one conductor (e.g., from conductor 24) to another (i.e., conductor 26). Redirecting the electric current I is performed by simultaneously closing one of the switches 34 and 40 and opening the other switch. Switch 34 is switched between the closed and open states by using control signal 36, and switch 40 is switched between the closed and open states by using control signal 38, which is the logical inverse of control signal 36. Logical inversion of control signal 36 is performed by an inverter 39, which is a "break-before-make" switching device.

A logic state "1" (also known as USB logical state "K") is generated (i.e., a binary digit "1" is transmitted from device 22 to host device 20) by simultaneously closing switch 34 (a 'first' switch) and opening switch 40 (a 'second' switch) to enable the current I to flow through switch 34, to thereby generate, on the D+termination resistors 30 and 42, a voltage that is sensed and interpreted by host device 20 as a logical state equivalently known as "D+", "K", or "1". Likewise, a logic state "0" (also known as USB logical state "J") is generated by simultaneously opening switch 34 and closing switch 40 to enable the current I to flow through switch 40, to thereby generate on the D− termination resistors 28 and 44 a voltage that is sensed and interpreted by host 20 as a logical state equivalently known as "D−", "J", or "0".

An ideal switching element would generate an ideal square-like wave, which would require changing the signal from the high to the low state instantaneously and without distortions. However, practically, this is impossible to achieve because an instantaneous change would require an infinite frequency bandwidth. Regarding FIG. 1, switching between switches 34 and 40 would ideally result in the current I flowing either through switch 34, in which case $I_1=I$ and $I_2=0$, or through switch 40, in which case $I_1=0$ and $I_2=I$. However, practical switches, such as switches 34 and 40, which typically are Metal Oxide Semiconductor Field Effect Transistor (MOSFET) switches, introduce a finite transition switching time (in the range of tenths to hundreds of picoseconds (psec)) in each switching cycle. During the switching transition time both switches are in a mid-position state, meaning that each of switches 34 and 40 is neither fully closed nor fully open. This results in a portion of the current I flowing through switch 34, meaning that $0<I_1<I$, and another portion of the current I flowing through switch 40, meaning that $0<I_2<I$, where, according to Kirchhoff's Current Law (also known as "Kirchhoff's first law"), $I_1+I_2=I$ at any given time. Within each transition time each of the signals $C1(t)$ and $C2(t)$, which respectively result from, or correspond to, the current I1 and I2, has a transition edge (not shown in FIG. 1) that has a finite slew rate. In electronics, "slew rate" represents rate of change of a signal in volts per second. Limitations in slew rate capability usually give rise to nonlinear effects in electronic amplifiers.

Choosing a slew rate is a matter of tradeoff between CMI and DMI. That is, using a fast (high) slew rate (i.e., using short transition time) results in low CMI interference, which is desirable. However, using a slew rate which is too fast results in high harmonics, which is a major cause for DMI interference. In terms of reducing DMI interference, it is, therefore, desired to use slow slew rates (that is, to use long transition times), and in terms of reducing CMI interference it is, therefore, desired to use fast slew rates (that is, to use short transition times). However, in order not to exceed allowed levels of CM and DMI interferences, communication standards limit the minimum and maximum temporal width (duration) of the transition time, which is the time period during which currents, which flow through switching elements such as switches 34 and 40, change from their minimal value to their maximal value. For example, in USB communications the maximum time period during which a current, which flows through a switching element increases from 20% to 80% (or decreases from 80% to 20%) of its maximum magnitude should not exceed approximately 500 picoseconds. Nevertheless, using even the fastest slew rate (i.e., shortest transition time) allowed by the relevant communication standards still results in some of the current I flowing both in conductor 24 and conductor 26 in the same direction, which, as explained above, is a major cause for CMI interference.

FIG. 2 shows three timing diagrams, generally shown at 201, 202, and 203, that are associated with switching system 102 of FIG. 1. Timing diagram 201 corresponds to the signal $C1(t)$, which results from, or corresponds to, the current $I_1$ flowing through conductor 24 (a first conductor of the involved differential communication link) and resistor R3 whenever switch 34 transitions from the open state to the closed state and controllable switch 40 transitions from the closed state to the open state. Likewise, timing diagram 202 corresponds to the signal $C2(t)$, which results from, or corresponds to, the current $I_2$ flowing through conductor 26 (a second conductor of the differential communication link) and resistor R4 whenever switch 40 transitions from the open state to the closed state and switch 34 transitions from the closed state to the open state.

It is noted that each of signals $C1(t)$ and $C2(t)$ of FIGS. 1 and 2 may be a current signal (i.e., the current signal flowing in/through the respective conductors 24 and 26), or a voltage signal that results from, correspond to, or associated with, the current signal flowing through the respective resistors 42 and 44. The waveforms of signals $C1(t)$ and $C2(t)$ therefore have the same, or substantially the same, shape, including the transition edges, regardless of whether $C1(t)$ and $C2(t)$ are current signals or voltage signals. In addition, signals $C1(t)$ and $C2(t)$ are shown in FIG. 2, and also in the other relevant drawings, normalized. This clarification (i.e., C(i) being current signal or voltage signal, and C(i) being normalized) is applicable to C(1) and C(2) throughout the description. In addition, the terms "C(1)" and "first signal" are interchangeable used herein, as are the terms "C(2) and "second signal".

F(t), shown at 203, was calculated using signals $C1(t)$ and $C2(t)$ in the way described below. "F(t)" represents, or is indicative of, a common mode noise signal. During periods 212, switch 34 is fully closed and switch 40 is fully open, whereas during period 213 switch 34 is fully open and switch 40 is fully closed. However, as stated above, during transition times, such as during exemplary transition times 220, 221, and 222, switches 34 and 40 are in a mid-position state. Namely, during period 220, switch 34 is not yet fully open and switch 40 is not yet fully closed; during period 221, switch 34 is not yet fully closed and switch 40 is not yet fully open; and during period 222, switch 34 is not yet fully open and switch 40 is not yet fully closed.

Switches such as switches 34 and 40 of FIG. 1 are typically implemented by a MOSFET transistor. The mid-position state of an analog MOSFET switch is determined by its current-voltage (V/I) relationship. Thus, due to the current-voltage (V/I) relationship in MOSFET transistors, which is expressed in equation (1), the transition portions, or transition edges, of $C1(t)$ and $C2(t)$, respectively shown in 201 and 202 in FIG. 2, resemble an exponential curve. The current-voltage relationship in a MOSFET transistor is described, for example, in "CMOS, Circuit Design, Layout, and Simulation" (by R. Jacob Baker, 2nd edition, p. 142).

$$I_D = \mu_n C_{ox} \frac{W}{L}\left((V_{GS} - V_{th})V_{DS} - \frac{V_{DS}^2}{2}\right) \quad (1)$$
$$= \beta x \left[(V_{GS} - V_{th})V_{DS} - \frac{V_{DS}^2}{2}\right]$$
$$= -aV_{DS}^2 + bV_{DS}$$

In equation (1), '$I_D$' is the current passing from the drain ("D") of the MOSFET transistor to its source ("S"), '$\mu_n$' is the charge-carrier mobility, '$C_{ox}$' is the transistor's gate oxide capacitance per unit area, 'W' is the transistor's gate width, 'L' is the transistor's gate length, '$V_{GS}$' is the voltage between the transistor's gate ("G") and source, '$V_{th}$' is the transistor's threshold voltage, and '$V_{DS}$' is the voltage between the transistor's drain and source.

The instant inventor has found that the exponential-like behavior of analog MOSFET switches during transition times is a major cause of CMI interferences. The inventor has also found that the effect of this behavior on the CMI can be quantified by equation (2), $$F(t)=ABS\{ABS[C1(t)-C2(t)]-[C1(t)+C2(t)]\} \quad (2)$$

where F(t) is a value calculated at time t, where 't' is a point in time occurring within the transition time period(s) (220, 221 and 222), that is, during the mid-position state of the involved switches, and C1(t) and C2(t) are the signals passing through conductors 24 and 26, respectively, of FIG. 1. Outside the transition times C1(t) and C2(t) resume their normalized values of 1.0 or 0.0 and F(t) becomes 0.0.

By way of demonstration, three values of F(t), shown in 203, will now be calculated, at times t1, t2, and t3. At time t1 C1(t1)=1.0 and C2(t1)=0.0. Therefore, F(t)=ABS{ABS[1.0−0.0]−[1.0+0.0]}=0.0, shown at 231. At time t2, C1(C2)0.5 and C2(t2)=0.5. Therefore, F(t)=ABS{ABS[0.5−0.5]−[0.5+0.5]}1=0.0, shown at 232. At time t3, C1(t3)−1.0 and C2(t3)= 0.0. Therefore, F(t)=ABS{ABS[0.0−1.0]−[0.0+1.0]}=0.0, shown at 233. As shown in FIG. 2, F(t) increases from 0.0 to 1.0 between t1 and t2, and decreases from 1.0 to 0.0 between t2 and t3.

Because F(t) reflects the transition characteristics of the switches, the extent to which the switches' transition times affect the CMI interference can be estimated by calculating the area under the curve of (i.e., the "energy" of) F(t) by integrating F(t) over one transition time (i.e., assuming that all, or most of the transition times are identical). In general, the greater the "energy" of F(t), the larger the detrimental effect of the switches' transitions is on the CMI interference, for which reason F(t) is also referred to herein as "common mode noise indicator" (CMNI).

An Eye-diagram Obtained without Using a Common Mode Choke

The CMI caused by switches such as switches 34 and 40 of FIG. 1 can be visualized by a technique using what is known as an "eye pattern" (or "eye diagram"). An "eye pattern" is an oscilloscope display in which a digital data signal is repetitively sampled and the samples are applied to the oscilloscope's vertical input, while the data rate triggers the horizontal sweep.

Several system performance measures can be observed in the eye diagram. An open eye pattern is correlated with minimal signal distortion; distortion of the signal waveform due to noise and other interferences appears as closure of the eye pattern. Thus, in general, the eye opening, which is the eye height eak-to-peak), provides a measure of the additive noise in the signal. Bye overshoot and eye undershoot provide a measure of the peak distortion, and the eye width provides a measure of timing synchronization and jitter effects. Using eye-diagrams as a signal assessment tool is described, for example, in "Digital Communication" (by John G. Proakis, Third edition, p. 541) and in "High Speed USB Platform Design Guidelines" (Rev. 1.0, Apr. 18, 2001).

FIG. 3 shows an eye diagram, or eye pattern, that is associated with a typical CMI noisy and distorted signal that results from a conventional switching system associated with USB communication. Four zones are discernible in FIG. 3:
1) D+ to D− transitions (logical state "1" to logical state "0" changes), shown at 62 and 67.
2) D− to D+ transitions (logical state "0" to logical state "1" changes), shown at 64 and 68.
3) D+ to D+ transitions (shown at 60). A "D+" to "D+" transition occurs whenever device 22 communicates to host 20 at least two successive ones (",..., 1, 1, ...,") while an automatic non-return-to-zero-inverter ("NRZI") mechanism, which is a mechanism for maintaining clock synchronization, is in a deactivated state. In such occurrences, switch 34 is intermittently closed and opened (repetitively) while, at the same time, switch 40 is held open, and
4) D− to D− transitions (shown at 66). A D− to D− transition occurs whenever device 22 communicates to host 20 at least two successive zeros (",..., 0, 0, ...,"). In such occurrences, switch 40 is intermittently closed and opened (repetitively) while, at the same time, switch 34 is held open.

"NRZI" is a method of mapping a binary signal to a physical signal for transmission over some transmission medium. In USB, NRZI means transitioning the signal when signaling zero, and maintaining the signal at a steady level when signaling one. NRZI encoding is used, for example, for recording on magnetic tape and for data transmission in the standard USB.

An ideal eye pattern would look like theoretical rectangle 69 (shown by the dashed line in FIG. 3), which represents zero switching times. Segments 62, 64, 67 and 68, which constitute deviations from the theoretical rectangle 69, represent transition times during which the switches (e.g., switches 34 and 40 of FIG. 1) are in mid-position state, causing a current to flow through both switches, and thus in both conductors, in the same direction and at the same time. Reference hexagon 61 represents a safety boundary that provides safety margins, e.g., at 70 and 71; to avoid unacceptable distortion or noise which would jeopardize the integrity of the communicated data this safety boundary 61 must not be crossed. The theoretical safety boundary 61 is defined in data communication standards such as the USB standard.

Segment 68 is a continuation of segment 64. That is, segments 64 and 68 form a first transition edge that is visually split (by the test equipment) into two sections. Likewise, segment 67 is a continuation of segment 62, and both segments (i.e., segments 62 and 67) form a second transition edge. Reference rulers 63 and 65 have been added to the eye pattern to emphasis the relatively linear behavior of D− to D+ transitions (logical state "0" to logical state "1" changes), as represented by segments 64 and 68. As may be appreciated from FIG. 3, the transition edge formed by segments 64 and 68 and the transition edge formed by segments 62 and 67, each consists of one, relatively linear, segment.

Using a Common Mode Choke

Traditionally, the problem caused by CMI is mitigated by using a special type of inductor or choke coil, which is known in the field as "common mode choke". Ideally, choke coils, whose electrical behavior strongly depends, among other things, on their self-inductance ("L"), block alternating current while passing direct current. A typical common mode choke for mitigating CMI, which is shown in FIG. 4 (for example), is discussed in "High Speed USB Platform Design Guidelines" (revision 1.0, by Intel Corporation, USA, 2000-01). Briefly, a common mode choke, such as the one shown in FIG. 4, attenuates common mode interference signals in a USB cable without interfering with the differential signal flow. However, such chokes cause other types of distortions, such as unmatched impedance, and, in addition, they tend to suppress the relatively high frequency USB signal due to their low-pass filtering basic nature.

FIG. 5 schematically illustrates a USB device 501 that is connected to a USB host 502 via a common mode choke (shown schematically at 90), such as that shown in FIG. 4. Other than choke 90, FIG. 5 corresponds to FIG. 1, and the components shown in FIG. 5, although not numbered, may be deemed identical or similar to those of FIG. 1. The USB connectors, as well as other components of device 501 and host device 502, are not shown in FIG. 5 for simplicity.

An Eye-diagram Obtained by using a Common Mode Choke

FIG. 6 demonstrates the effect of a common mode choke such as common mode choke 90 of FIG. 5 on the eye pattern. Comparing the eye patterns of FIGS. 3 and 6, segments 67 and 68 of FIG. 3 are relatively linear, in contrast to segments 77 and 78 of hexagon 600 of FIG. 6, which are slightly curved (the curvature of segment 78 is emphasized by dashed line 662). As a result of the curvature of segments 77 and 78, the safety margins shown at 80 and 81, which are the areas bounded in part by segments 77 and 78 of hexagon 600 and the corresponding sides of reference hexagon 661, are somewhat smaller than the safety margins 70 and 71 in FIG. 3.

Curved transition edges, such as are represented by 77 and 78 in FIG. 6, mitigate the CMI problem (i.e., relative to linear transition edges such as are represented approximately by 67 and 68 in FIG. 3). However, using a common mode choke is problematic because common mode chokes are designed on a trial-and-error basis. In selecting a common mode choke, its electrical and mechanical characteristics are considered, as are the frequency and magnitude of the noise that has to be attenuated. If the choke passes the relevant EMI tests, it still has to be tested for the effect it has on the signal quality. If the signal quality is unsatisfactory, the choke has to be redesigned. This process is repeated until the signal quality is acceptable.

In addition, it is desirable to fabricate communication controllers, which are widely used with USB-driven devices, in increasingly smaller sizes, and the use of common mode chokes, which are relatively large, impedes this trend. Furthermore, circuit designers seek to reduce the component count (i.e., bill of materials—BOM) in order to simplify the design and to reduce the overhead material cost.

Accordingly, it would be desirable to have a method for suppressing CMI in data communication systems, and in particular in USB-driven circuits, without using common mode chokes. It would also be desirable for such a method to expand the above-discussed safety margin (represented by e.g. areas 70 and 71 in FIG. 3), at least by some discernible degree.

SUMMARY

The following embodiments and aspects thereof are described and illustrated in conjunction with systems, tools, and methods, which are meant to be exemplary and illustrative but not limiting in scope.

A method is provided for transmitting one binary digit at a time via a differential communication channel having a first conductor and a second conductor, the method including providing, by a current source, a current to the first conductor while isolating the second conductor from the current source, to thereby transmit a first binary digit; and, responsive to a command to transmit a second binary digit, (i) decreasing from a maximum value to zero an amount of the current provided to the first conductor and (ii) increasing from zero to a maximum value an amount of the current provided by the current source to the second conductor. The decreasing and the increasing are performed (a) simultaneously, in such a manner that the amount of the current provided to the first conductor decreases at the same rate as the amount of the current provided to the second conductor increases, and such that each of a first signal corresponding to the current provided to the first conductor and a second signal corresponding to the current provided to the second conductor has a transition edge having a leading section, a midsection and a trailing section, with the midsection of the transition edge having an average slope that is greater than an average slope of the leading section of the transition edge and that is greater than an average slope of the trailing section of the transition edge.

In one embodiment the transition edge of the first signal and the transition edge of the second signal intersect at an intersection point and are symmetric about the intersection point. In another embodiment the transition edge of the first signal and the transition edge of the second signal intersect at an intersection point and are asymmetric about the intersection point.

The magnitude of the first signal at a lower endpoint of the midsection of the transition edge thereof may be greater than 20 percent of the maximum value of the first signal, and a magnitude of the first signal at a higher endpoint of the midsection of the transition edge thereof may be less than 80 percent of the maximum value of the first signal, and wherein a magnitude of the second signal at a lower endpoint of the midsection of the transition edge thereof may be greater than 20 percent of the maximum value of the second signal, and a magnitude of the second signal at a higher endpoint of the midsection of the transition edge thereof may be less than 80 percent of the maximum value of the second signal.

For each of the transition edges, the midsection thereof may be linear or substantially linear. Each of the transition edges may a temporal duration complying with the universal bus ("USB") protocol, or with like similar, or another communication protocol or communication standard. For each of the transition edges, the average slope of the midsection thereof may be less than 0.227, the average slope of the leading section thereof may be between 0.06 and 0.0909, and the average slope of the trailing section thereof may be between 0.06 and 0.0909.

A system is provided for transmitting digital data, one binary digit at a time, via a differential communication channel, the system including a switching system that is operatively interposed between the current source and the differential communication channel, and a controller that is operative to issue one or more control signals to the switching system: (i) to connect the current source only to the first conductor during transmission of a first binary digit, and to connect the current source only to the second conductor during transmission of a second, different binary digit; and, (ii) while the current source is being disconnected from the first conductor and connected to the second conductor, to (a) decrease from a maximum value to zero an amount of current provided by the current source to the first conductor and (b) increase from zero to a maximum value an amount of current provided by the current source to the second conductor.

The controller is operative to issue the control signals in such a manner that (1) the decreasing and the increasing are performed simultaneously, (2) the amount of the current provided to the first conductor decreases at the same rate as the amount of the current provided to the second conductor increases, and (3) each of a first signal corresponding to the current provided to the first conductor and a second signal corresponding to the current provided to the second conductor has a transition edge having a leading section, a midsection and a trailing section, with the midsection of the transition edge having an average slope that is greater than an average slope of the leading section of the transition edge and that is greater than an average slope of the trailing section of the transition edge.

In one embodiment the system may include a first set of two or more controllable switches that are connected in parallel and interposed between the current source and the first conductor, each of the two or more controllable switches may independently be changeable, in response to one or more of the control signals issued by the controller, between a "cutoff" mode, a "linear" mode and a "saturation" mode; and a second set of two or more controllable switches that are connected in parallel and interposed between the current source and the second conductor, each of the two or more controllable switches may be independently changeable, in response to one or more of the control signals issued by said controller, between a "cutoff" mode, a "linear" mode and a "saturation" mode. The controller controls, via the issued control signals, the first set of two or more controllable switches to produce a composite current that corresponds to the transition edge associated with the first signal, and the second set of two or more controllable switches to produce another composite current that corresponds to the transition edge associated with the second signal.

For each of the first set of two or more controllable switches and the second set of two or more controllable switches, at least one of the controllable switches may be selectively operated in a cutoff mode, at least one of the controllable switches may be selectively operated in a saturation mode, and at least one of the controllable switches may be selectively operated in a linear mode.

In another embodiment the switching system includes a first controllable switch that is interposed between the current source and the first conductor; and a second controllable switch that is interposed between the current source and the second conductor. The controller controls, via the issued control signals, the first controllable switch to produce a composite current corresponding to the transition edge associated with the first signal, and the second controllable switch to produce a composite current corresponding to the transition edge associated with the second signal. The first controllable switch and the second controllable switch may selectively be operated in a cutoff mode, a saturation mode, or in a linear mode.

In addition to the exemplary aspects and embodiments described above, further aspects and embodiments will become apparent by reference to the figures and by study of the following detailed description.

BRIEF DESCRIPTION OF THE DRAWINGS

Exemplary embodiments are illustrated in referenced figures. It is intended that the embodiments disclosed herein are illustrative rather than restrictive. The disclosure, however, may better be understood with reference to the following detailed description when read with the accompanying figures, in which.

Figure 1:
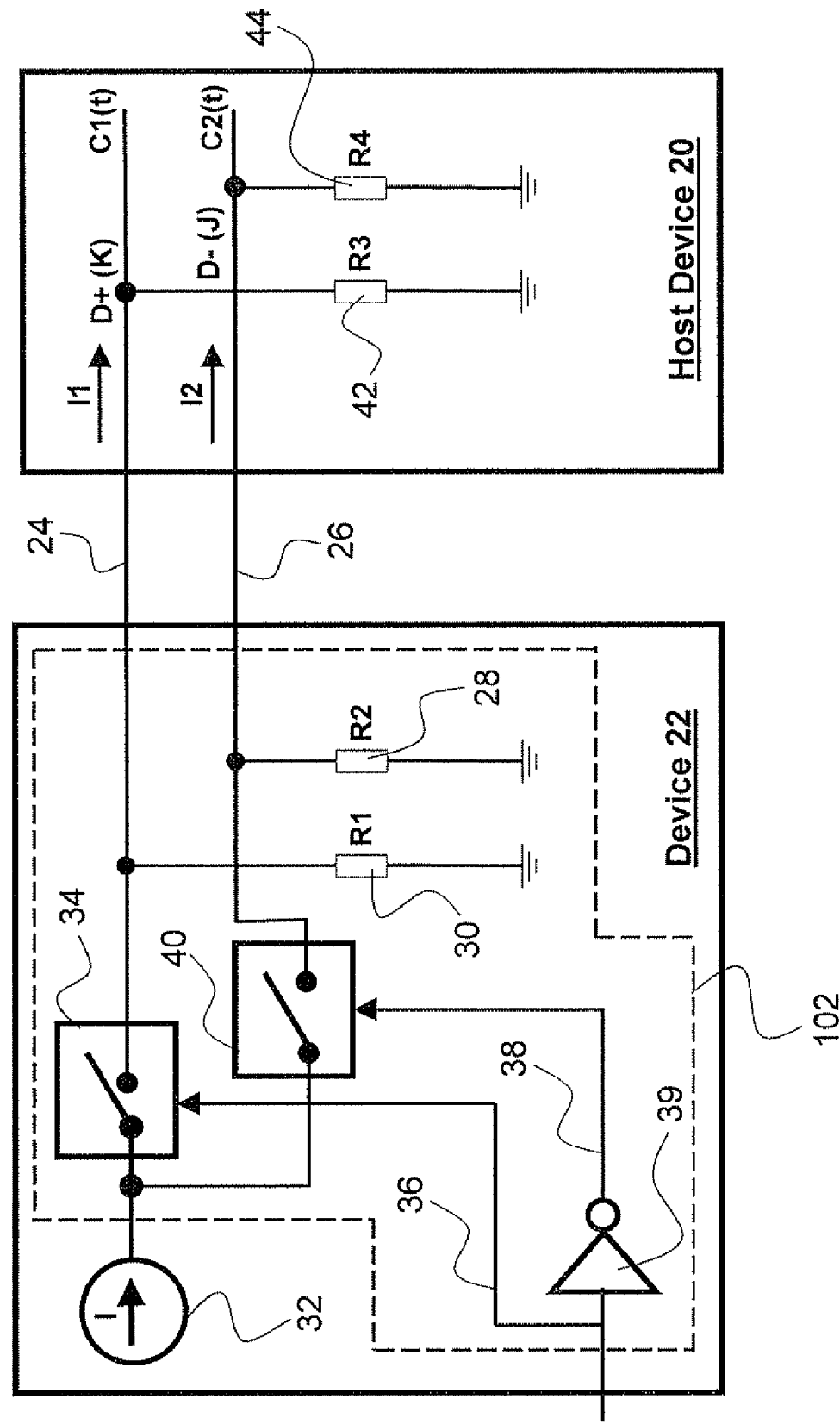
FIG. 1 (prior art) illustrates a typical differential communication link.

It will be appreciated that for simplicity and clarity of illustration, elements shown in the figures are not necessarily drawn to scale. Further, where considered appropriate, reference numerals may be repeated among the figures to indicate like, corresponding or analogous elements.

DETAILED DESCRIPTION

The claims below will be better understood by referring to the present detailed description of example embodiments of the invention, in association with the figures. This description is intended not to limit the scope of claims but instead to provide example embodiments of the invention.

As stated above, the inventor has found that the traditional switching behavior of MOSFET switches within the transition times contributes significantly to the CMI interference. Referring again to FIG. 2, the inventor has found that the CMI interference can be mitigated by reducing the area under the curve of F(t), and that the area under the curve of F(t) can be considerably reduced by using a special composite electric current that is generated by controlling the switching pattern of the switching system as a whole. In other words, the present disclosure involves manipulation of a switching system in such a way that the transition edges of $C1(t)$ and $C2(t)$ are caused to deviate from the traditional transition pattern of the signal(s), as illustrated, for example, in FIG. 2, in such a manner as to reduce the area of the curve under F(t) and, thus, the CMI interference.

Deviation from the traditional transition pattern includes causing the transition edges to be segmented into two or more linear segments, each of the linear segments having a different slope. Mitigating CMI interferences can thereby be achieved without using a common mode choke, which is beneficial in terms of both lowering the cost and reducing the size of the involved communication interface or communication transmitter.

Figure 7:
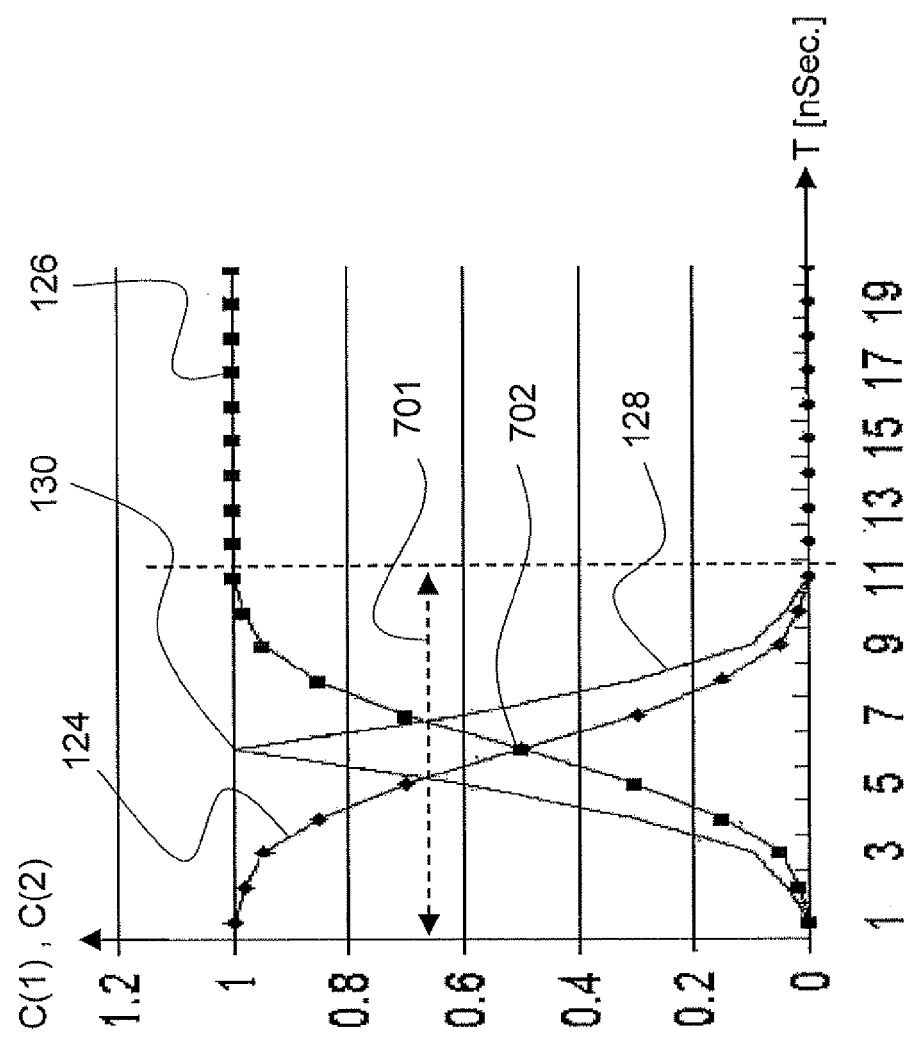
FIG. 7 (prior art) shows simulation results of signals when controllable switches of a differential communication link are in mid-position state.

FIG. 7 shows simulation of C1($t$) and C2($t$) without using a common mode choke, or any other CMI-reducing method, and the resulting F(t). Signal C1($t$), shown at 124, represents the signal in the USB's "D+" conductor, and C2($t$), shown at 126, represents the signal in the USB's "D+" conductor. F(t) (or, equivalently, the common mode noise indicator (CMNI)), shown at 128) was calculated using formula (2) above. The energy Z of (i.e., the "area" under) F(t), which as stated above is indicative of the common mode interference (CMI), was calculated using formula (3) over one transition time (i.e., transition time 701).

$$Z = \sum_{t=0} \text{ABS}\{\text{ABS}[C1(t) - C2(t)] - [C1(t) + C2(t)]\} * \Delta t \quad (3)$$

The value of the current I associated with C1($t$) and C2($t$) was normalized, for which reason C1($t$) and C2($t$) are shown in FIG. 7 as having a maximum value of 1.0. Because C1($t$) and C2($t$) result from a common current of fixed value, the sum of C1($t$) and C2($t$) equals 1.0 at any given time, within and outside transition time 701. Consequently, each of C1($t$) and C2($t$) has, at intersection point 702 (where C1($t$) and C2($t$) intersect), a value equal to 0.5 and, by virtue of equation (2), F(t) reaches its peak 130 at intersection point 702.

The simulation results shown in FIG. 7, which are typical of a differential communication channel driven by a conventional switching system, were obtained using Microsoft "Excel" as simulation tool. Applying formula (3) to C1($t$) and C2($t$) of FIG. 7, Z=3.08.

In accordance with the present disclosure, the CMI interference is mitigated by reducing the value of Z by piecewise segmenting the transition edge of C1($t$) and the transition edge of C2($t$) into one or more linear, or substantially linear, segments, as discussed below in connection with FIGS. 8, 9, 10A-10D, and 14-16. The simulations illustrated in FIGS. 8 and 9 were also made using Microsoft Excel.

Segmenting a transition edge of C1($t$) and C2($t$) may be implemented, for example by approximating $I_D$ in equation (1) above by two linear lines, L1 and L2, as follows:

$$L1 = \frac{3b}{4} V_{DS} \quad \left(0 < V_{DS} < \frac{b}{4a}\right) \quad (4)$$

$$L2 = \frac{b}{4} V_{DS} + \frac{b^2}{8a} \quad \left(\frac{b}{4a} < V_{DS} < \frac{b}{2a}\right) \quad (5)$$

where 'a' and 'b' are constants. L1 and L2 are respectively shown at 888 and 889 in FIG. 8.

Figure 2:
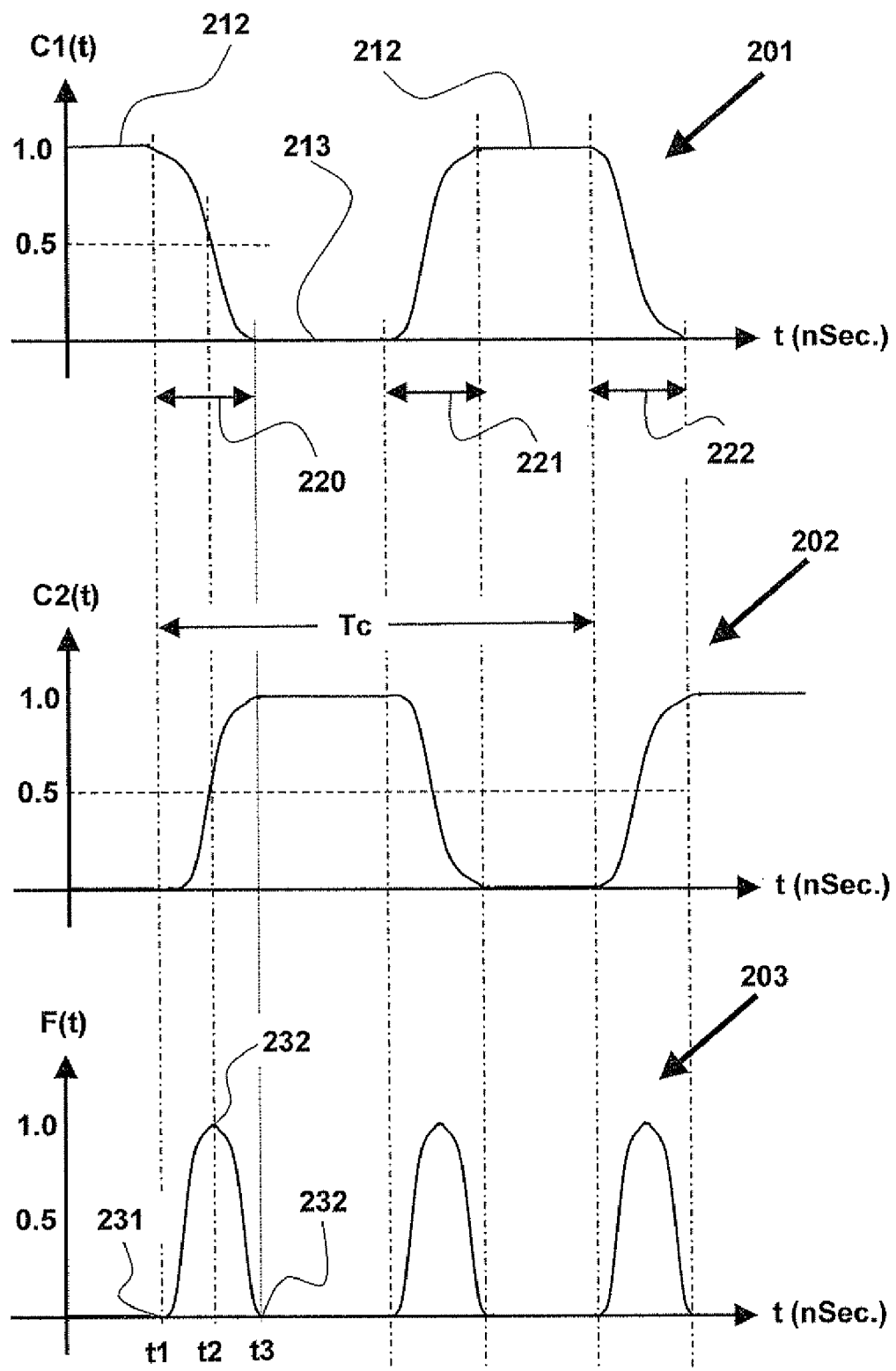
FIG. 2 illustrates timing diagrams associated with the differential communication link of FIG. 1.
Figure 3:
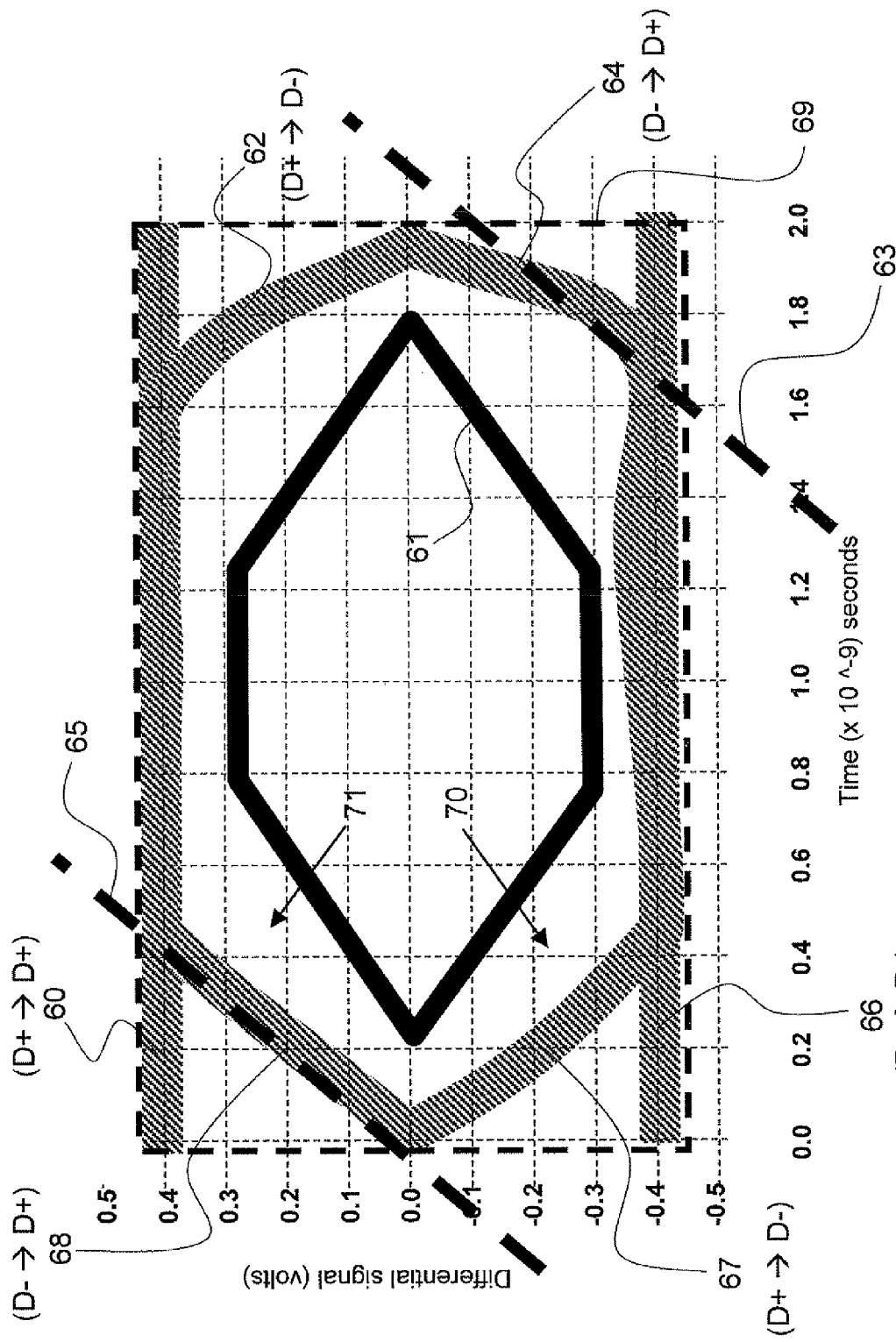
FIG. 3 (prior art) depicts an eye diagram that was obtained without using a common mode choke in the differential communication link of FIG. 1.
Figure 4:
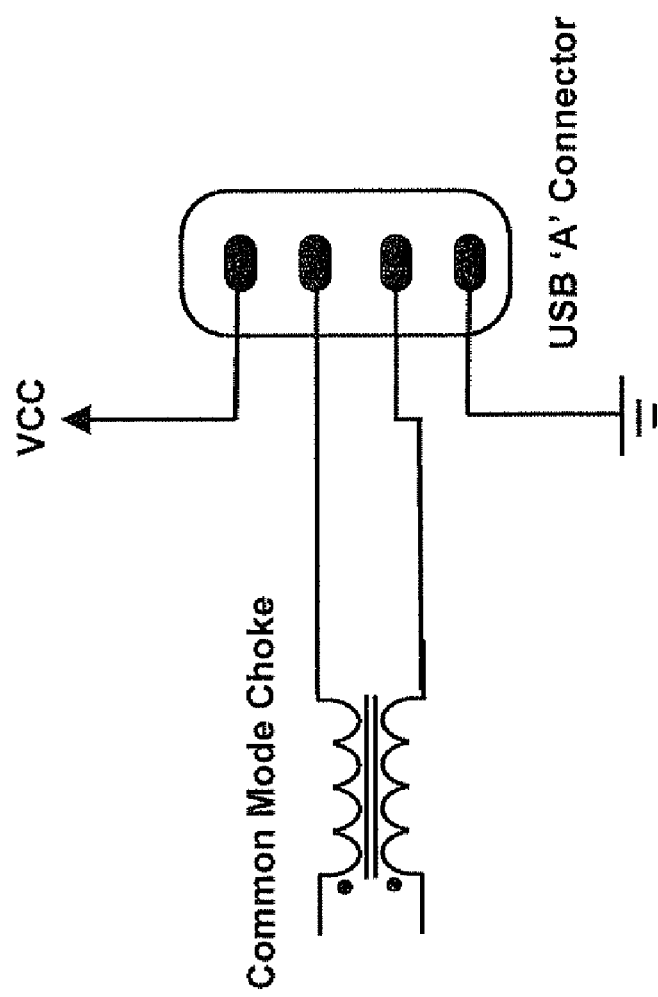
FIG. 4 (prior art) is a schematic of a typical common mode choke and electrostatic discharge (ESD) suppression components.
Figure 5:
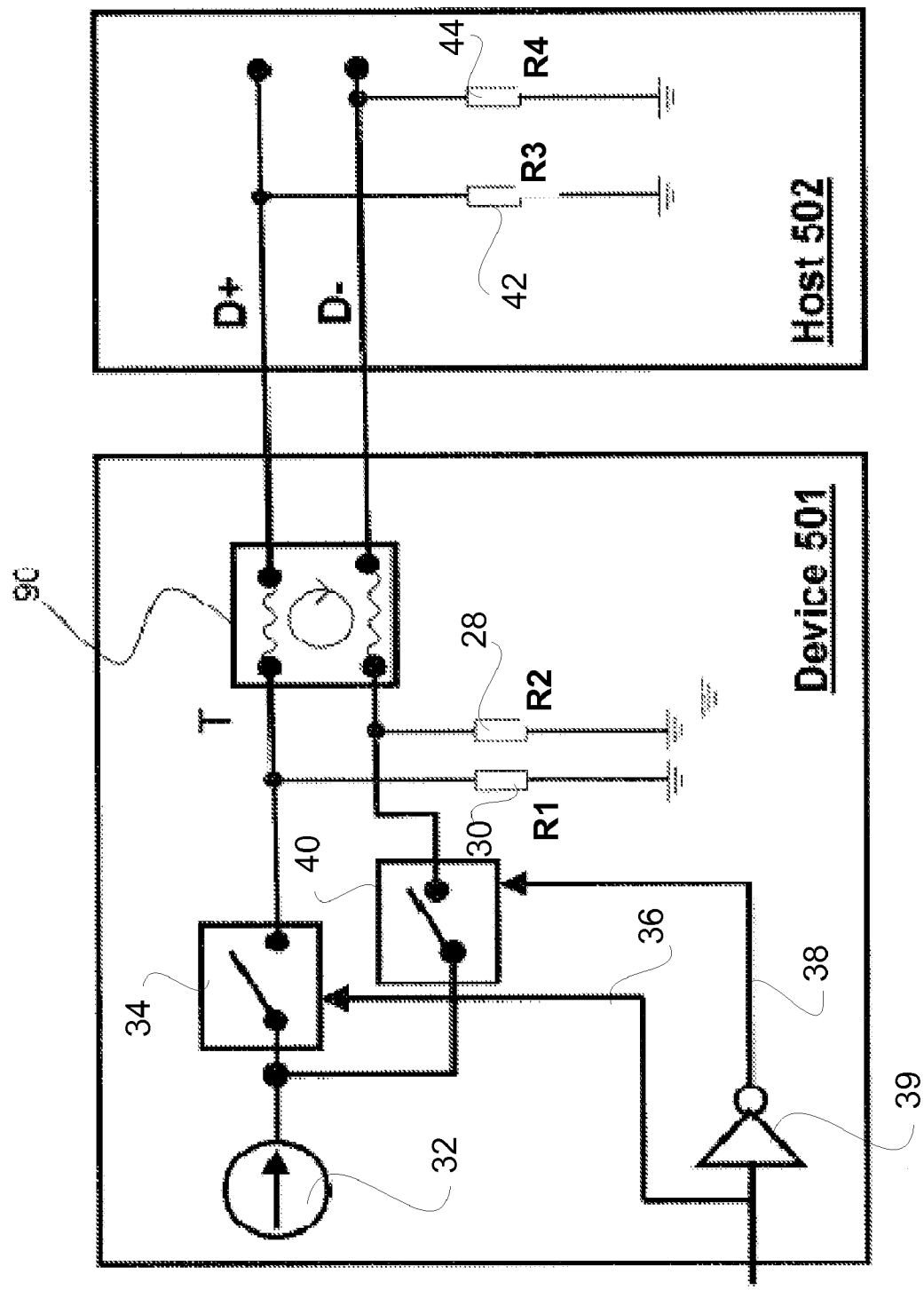
FIG. 5 (prior art) is a schematic of a differential communication link that includes a common mode choke.
Figure 6:
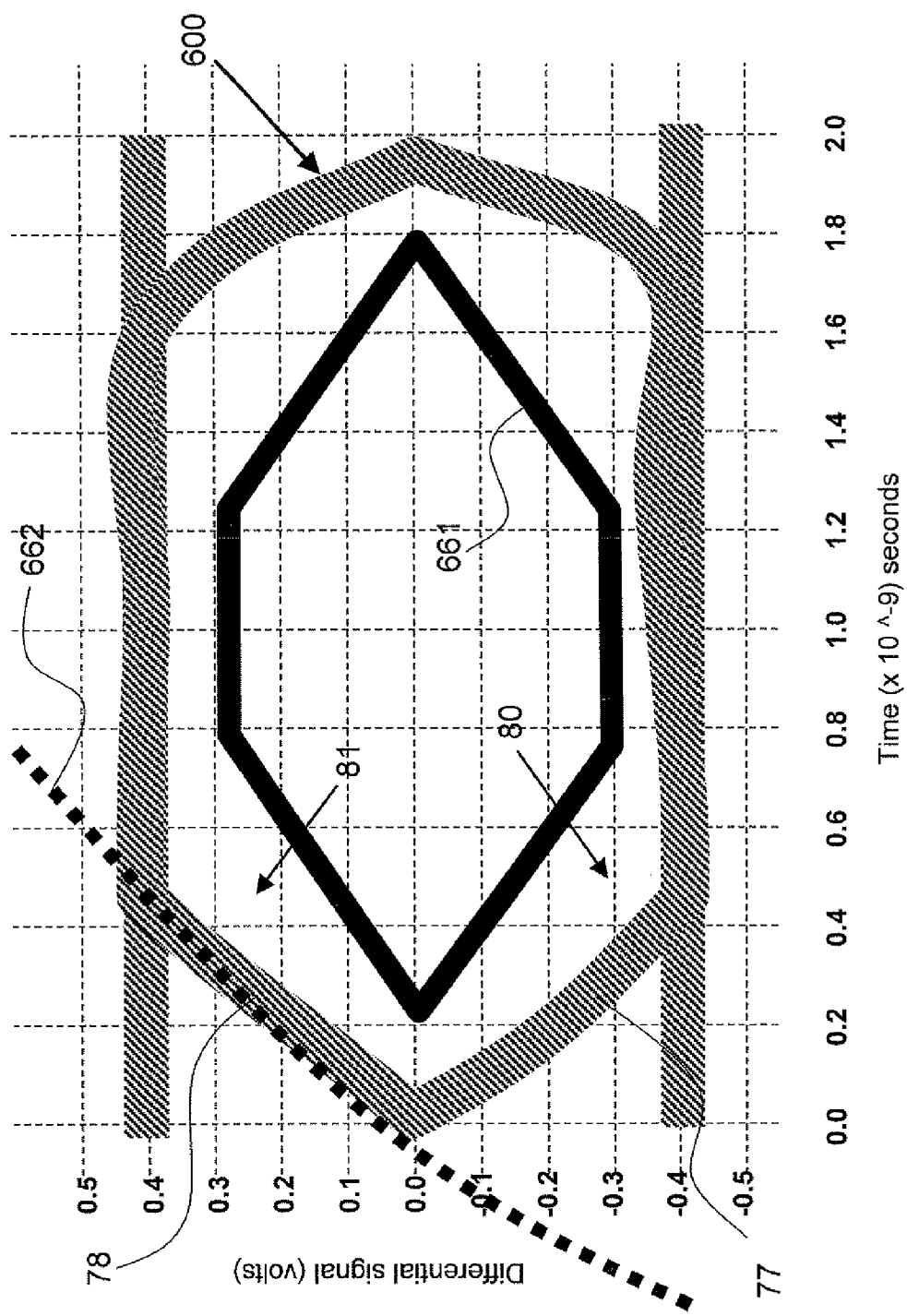
FIG. 6 (prior art) depicts an eye diagram that was obtained using a differential communication link having a common mode choke.

Traditional transition patterns are nearly linear sections (see the curves of C1($t$) and C2($t$) at transition times 220, 221 and 222 in FIG. 2), and merely changing the slope of such nearly linear sections (i.e., making them steeper) does not solve the CMI problem because of the following reason. Making the nearly linear sections' slop steeper than allowed by the relevant communication standards will expand the safety margin (e.g., areas 80 and 81 in FIG. 6) in the eye pattern, which is desirable. However, making the slope too steep will increase the DMI interferences due to high frequency harmonics. On the other hand, making the slopes too moderate will cause the eye pattern to partly or wholly overlap, or even cross the safety boundary, and, therefore, to breach the communication standard, which, practically, means corruption of communicated data.

Figure 8:
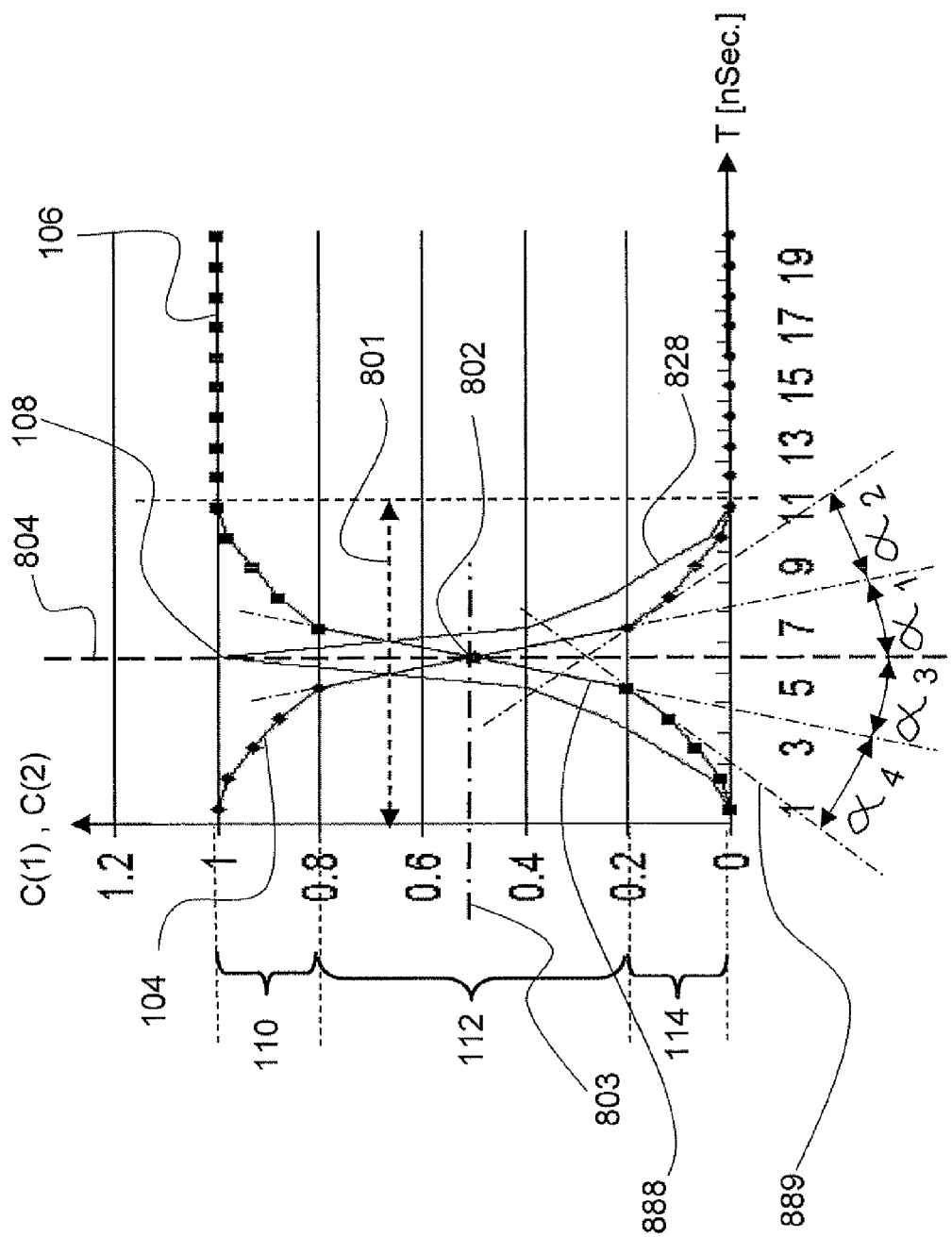
FIG. 8 illustrates simulated signals which have been segmented according to one example embodiment of the present disclosure.
Figure 9:
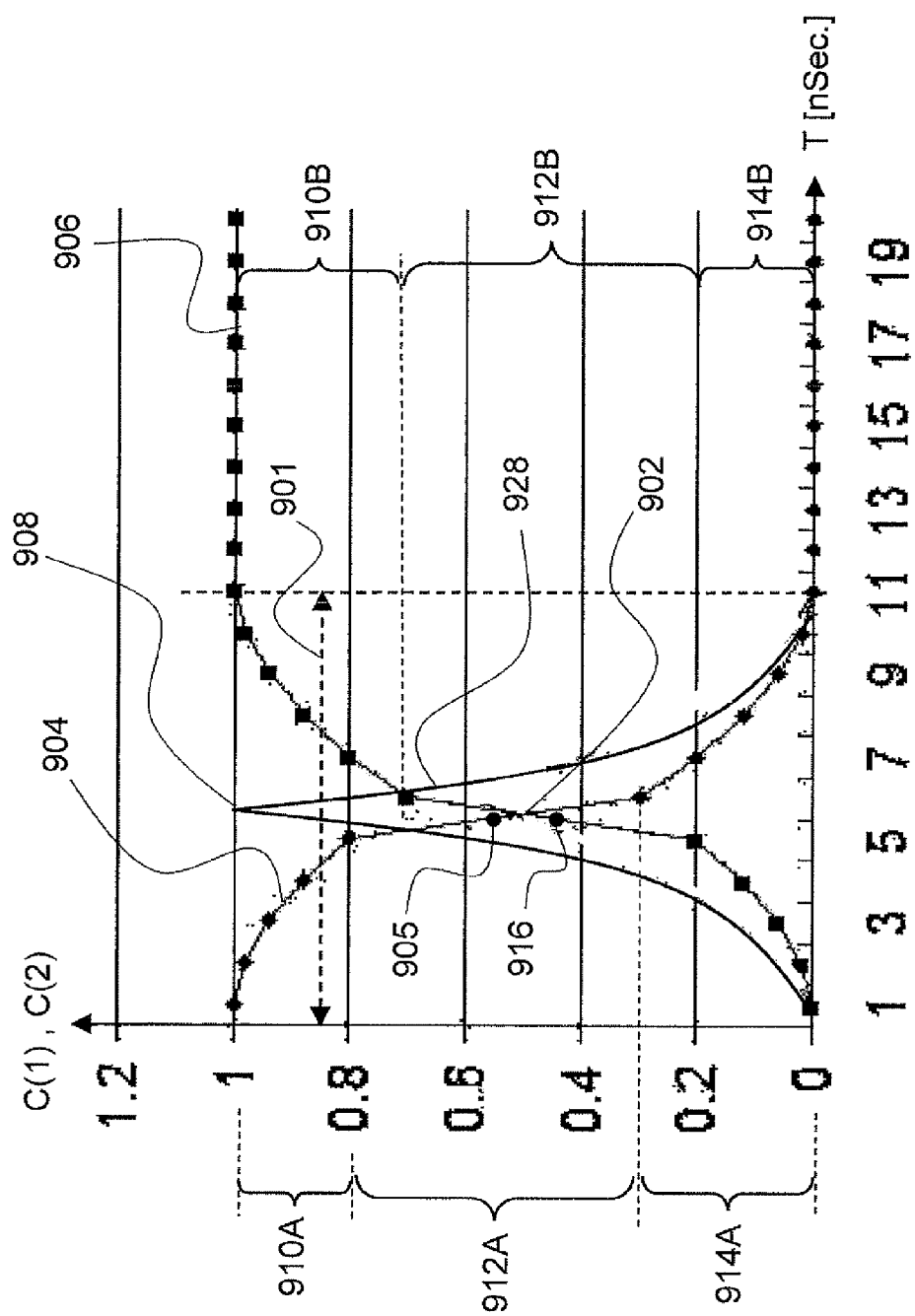
FIG. 9 illustrates simulated signals which have been segmented according to another example embodiment of the present disclosure.

However, by segmenting the transition edge into one or more segments, one or more of which may be linear or substantially linear, as exemplified in FIGS. 8 and 9, slopes of one or more segments of transition edges can, for a short period of time, be made steeper than would be considered acceptable in prior art practice, while maintaining a transition edge temporal duration satisfying relevant standards and keeping the DMI interferences negligible.

FIG. 8 shows transition edges within a transition time 301 according to one example embodiment of the present disclosure. According to the present disclosure transition edges may have a temporal duration complying with a universal bus ("USB") protocol, or with another protocol or standard. Each of C1($t$) 104 and C2($t$) 106 has a transition edge within the transition temporal period 801, which consists of an upper section 110, a linear midsection 112, and a lower section 114. Upper section 110 of signal 104 is referred to as a "leading section" of C(1) 104 because this section temporally precedes the other sections (i.e., linear midsection 112 and lower section 114) of C(1) 104. Lower section 114 of C(1) 104 is referred to as a "trailing section" of C(1) 104 because this section is the time-wise last section of the transition edge of C(1) 104. Likewise, lower section 114 and upper section 110 of C(2) 106 are respectively referred to as a "leading section" and a "trailing section" of C(2) 106.

The "length" of the midsections 112 of C1($t$) and C2($t$) can be chosen to be, for example, 60% of the full range OF C(1) and C(2). As explained above, both C1($t$) and C2($t$) are fed by a common direct current source. Therefore, the midsection of C1($t$) 104 and the midsection of C2($t$) 106 have the same "length", which is measured as the percentage (%) of the magnitude or full range of C(1) and C(2). For example, the length of the midsections of C1($t$) 104 and C2($t$) 106 may be 60% (e.g. between 20% and 80%) of the signal's full range, as illustrated, for example, in FIG. 8. The midsection of C1($t$) may be shifted relative to the midsection of C2($t$). For example, the lowest and highest endpoints of the midsection of C1($t$) may respectively be at 30% and 80% of the signal's full range, or full magnitude, and the lowest and highest endpoints of the midsection of C2($t$) may respectively be at 20% and 70% of the signal's full range, as illustrated, for example, in FIG. 9.

A midsection, which, as explained herein, may be linear or substantially linear, is delimited by an adjacent leading section and an adjacent trailing section. A linear midsection may be located in the middle of a transition edge, as is the case in FIG. 8 which shows intersection point 802 of the transition edges coinciding with the midpoints of midsections 112. If an intersection point of two transition edges coincides with the midpoint of a falling linear midsection, then the midpoint of the falling linear midsection is also the midpoint of the rising linear midsection, because the two transition edges mirror each other magnitude-wise. In such cases, it may be said that the transition edges of C1($t$) 104 and C2($t$) 106 are magnitude-wise symmetric (i.e., they are symmetric about horizontal symmetry line 803). Since transition edges of C1($t$) 104 and C2($t$) 106 are also symmetric about symmetry line 804, the transition edges of C1($t$) 104 and C2($t$) 106 are regarded as fully symmetric, or "symmetric" for short. The transition edges of C1($t$) 104 and C2($t$) 106 are magnitude-wise symmetric (i.e., they are symmetric about the horizontal symmetric line 803) because the falling transition edge of C1(*t*) 104 falls contemporaneously with, and at the same rate as, the rising of the rising transition edge of C2(*t*) 106. However, in other example embodiments the linear midsection of a transition edge may "shift", relative to the intersection point of the falling transition edge and rising transition edge, towards the leading section or towards the trailing section of that transition edge. If the linear midsections are shifted relative to the intersection point of the transition edges, then the intersection point of the transition edges and the midpoints of the linear midsections do not coincide, as shown in, and discussed below in connection with, FIG. 9. In such a case it may be said that, even though the transition edges of C1(*t*) and C2(*t*) are magnitude-wise (i.e., horizontally) symmetric about their intersection point, they may be regarded as being only half symmetric because the transition edges of C1(*t*) and C2(*t*) are asymmetric about an imaginary vertical line that passes through the intersection point. Accordingly, if the midpoint of a midsection of a transition edge shifts relative to the intersection point in question, the transition edges are regarded as "asymmetric".

Returning again to FIG. 8, the leading sections 110 and 114 of signals 104 and 106, respectively, and the trailing sections 114 and 110 of signals 104 and 106, respectively, are curved. However, a leading section or a trailing section of a transition edge may be linear or substantially linear (not shown in FIG. 8). A leading section or a trailing section of a transition edge may further be segmented into two or more sub-sections (not shown in FIG. 8) that may linear or substantially linear.

The two midsections 112 may have the same length or different lengths. The midsection 112 in each transition edge is steeper than its adjacent leading and trailing sections. By "steeper" is meant more closely aligned with the vertical line 804 (i.e., having a slope whose value is closer to that of the slope of vertical line 804), the alignment being measured by the angle α between the vertical line 804 and the tangential line of the involved section or midsection; namely, the smaller α is, the steeper the tangential line. For example, the midsection 112 of signal 104 is steeper than the trailing section 114 of signal 104 because, as demonstrated in FIG. 8, $\alpha_1 < \alpha_2$ (i.e., the midsection is more closely aligned with vertical line 804). Likewise, the midsection 112 of signal 106 is steeper than the leading section 114 of signal 106 because $\alpha_3 < \alpha_4$.

As explained above, the sum of signals 104 and 106 is fixed over time (i.e., C1(*t*)+C2(*t*)=constant over time), and, after normalizing C1(*t*) and C2(*t*), as shown in FIG. 8, C1(*t*)+C2(*t*)=1.0. Therefore, regardless of the way a transition edge is segmented, C1(*t*) and C2(*t*) are always magnitude-wise symmetric about horizontal line 803, which passes through intersection point 802 of C1(*t*) and C2(*t*). Further, an intersection point always has a value Y that equals Y=cons tan t/2. Intersection point 802, for example, has a value of Y=cons tan t/2=1.0/2=0.5.

As shown in FIG. 8, signals 104 and 106 are horizontally symmetric about intersection point 802 (which lies on symmetry line 803. Midsections 112 of signals 104 and 106 also have the same lowest point (i.e., 0.2) and the same highest point (i.e., 0.8), for which reason signals 104 and 106 are also vertically symmetric about intersection point 802, which, in this example embodiment, lies also on the vertical symmetry line 804. Being symmetric both horizontally (about symmetry line 803) and vertically (about symmetry line 804), signals 104 and 106 are said to be "fully symmetric", or "symmetric" for short. According to formula (2) above the maximum value of signal 828 (i.e., F(t)) occurs at the intersection points of signals 104 and 106 (i.e., whenever these signals have the same value). For example, peak 108 of signal 828 is shown in FIG. 8 as temporally coinciding with the intersection point 802.

Applying formula (3) to signals 104 and 106 over transition time 801 yields Z=2.64, which indicates a reduction, and therefore an improvement, in the CMI interference relative to FIG. 7, where Z=3.08, which represents the, so-called, "natural" behavior of F(t) of FIG. 7. The reduction in the value of Z can intuitively be understood from FIGS. 7 and 8: F(t) in FIG. 8 is noticeably narrower than in FIG. 7.

FIG. 9 shows exemplary transition edges during a transition time 901 according to another example embodiment of the present disclosure. C1(*t*) (shown at 904) has a falling transition edge within the transition time 901, which consists of a falling leading section 910A, which decreases from 1 to 0.8, a falling linear midsection 912A, which decreases from 0.8 to 0.3, and a falling trailing section 914A, which decreases from 0.3 to 0. C2(*t*) (shown at 906) has a rising transition edge within the transition time 901, which consists of a rising leading section 914B, which increases from 0 to 0.2, a rising linear midsection 912B, which increases from 0.2 to 0.7, and a rising trailing section 910B, which increases from 0.7 to 1.

The leading sections and trailing sections shown in FIG. 9 are fully curved. However, a leading section or a trailing section of a transition time shown in FIG. 9 may be partly curved or linear. A partially curved leading (or trailing) section may consist of one or more linear segments. Peak 908 of F(t) (shown at 928) always temporally coincides with the intersection point 902 of C1(*t*) 904 and C2(*t*) 906.

The linear midsection 912A of C1(*t*) 904 is somewhat shifted towards the leading section 910A of C1(*t*) 904 because the midpoint (shown at 905) of linear midsection 912A is higher than the intersection point of the two transition edges (i.e., intersection point 902). Put otherwise, the upper portion of linear midsection 912A, which is the portion above intersection point 902, is longer (i.e., it has a length equal to 0.8−0.5=0.3) than its lower portion (which has a length equal to 0.5−0.3=0.2), which is the portion below intersection point 902. In order to comply with the "C1(*t*)+C2(*t*)=constant" constraint, the linear midsection 912B of C2(*t*) 906 is shifted in the vertically opposite direction, towards the leading section 914B of C2(*t*) 906, as is demonstrated by the midpoint 916 of linear midsection 912B being lower than intersection point 902. Put otherwise, the upper portion of linear midsection 912B (which has a value equal to 0.7−05=0.2) is shorter than its lower portion (which has a value equal to 0.5−0.2=0.3). The lengths of both the linear midsection 912A and linear midsection 912B are identical (i.e., 0.5 in this example) because of the "C1(*t*)+C2(*t*)=constant" constraint.

If a falling linear midsection and a rising linear midsection within a transition time are shifted to vertically opposite directions relative to the intersection point, as demonstrated in FIG. 9, then C1(*t*) and C2(*t*) are said to be vertically asymmetric, or "asymmetric" for short, about the intersection point 902. Asymmetric C1(*t*) and C2(*t*) are yet half-symmetrical in the sense that, as explained above, C1(*t*) and C2(*t*) are always horizontally (i.e., magnitude-wise) symmetric about their intersection point. C1(*t*) 904 and C2(*t*) 906 are magnitude-wise symmetric about the intersection point because the falling transition edge of C1(*t*) 904 falls contemporaneously with the rising of the rising transition edge of C2(*t*) 906.

As in FIG. 8, linear midsections 912A and 912B are much steeper than their adjacent sections 910 and 914. Applying formula (3) to C1(*t*) and C2(*t*) of FIG. 9 to calculate the area under F(t) over one transition time 901 yields Z=2.2 (versus 3.08 in FIG. 7 and 2.64 of FIG. 8), which indicates an additional reduction, and therefore an additional improvement, in the CMI interference. Regarding FIGS. 8 and 9, the steeper the linear midsections of the transition edges are, the narrower F(t) is within the transition time(s) and, therefore, the smaller Z is, which is desirable, as discussed above. As explained above, too steep transition edges results in increased DMI interferences, which is undesirable. However, as demonstrated in FIGS. 8 and 9, CMI interferences can be reduced (i.e., relative to "un-choked" communication systems), without increasing DMI interferences, by manipulating the average slope of the transition edges. By "manipulating the average slope of a transition edge" is meant using a relatively very steep linear midsection, such as linear midsections 112 of FIG. 8 or linear midsections 912A and 912B of FIG. 9, and a relatively moderate (i.e., much less steep) adjacent leading section and trailing section.

Figure 10:
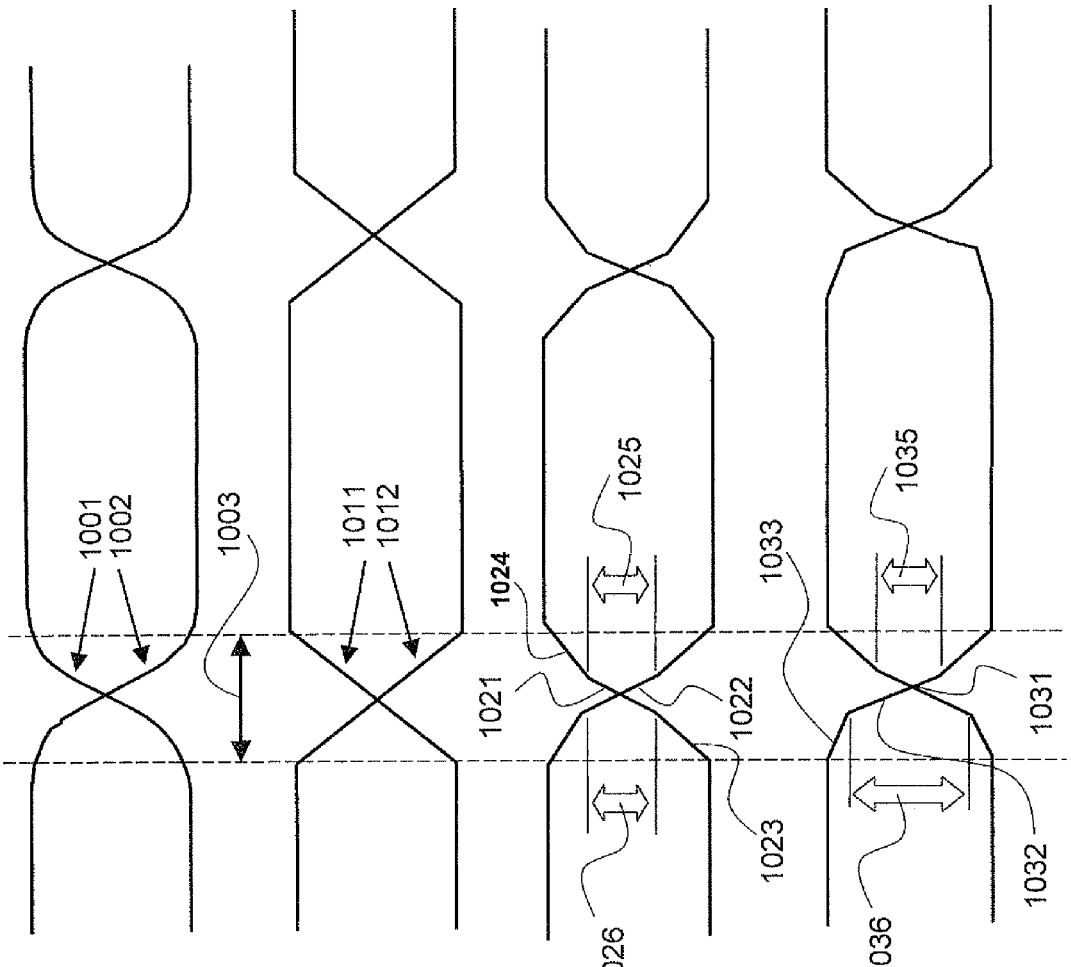
FIG. 10A (prior art) shows transition edges.
FIGS. 10B through 10D show various transition edges according to example embodiments of the present disclosure.

FIG. 10A shows typical conventional transition edges (shown at 1001 and 1002). Transition edges 1001 and 1002 are "conventional" in the sense that they have an exponential-like shape. FIGS. 10B through 10D show transition edges according to example embodiments of the present disclosure.

FIG. 10B shows a falling transition edge (shown at 1012) and a rising transition edge (shown at 1011). Falling transition edge 1012 and rising transition edge 1011 each consists of a single linear segment. In this respect it may be said that falling transition edge 1012 (and, likewise, rising transition edge 1011) includes a linear midsection but not leading and trailing sections (i.e. consists of a single linear section), or that the leading and trailing sections of falling transition edges 1012 (and, likewise, rising transition edge 1011) are linear extensions that form with the linear midsection (again) a single continuous linear segment.

FIG. 10C shows linear midsections (shown at 1021 and 1022), linear leading sections, and linear trailing sections. Linear midsection 1021, for example, is delimited by linear leading section 1023 and linear trailing section 1024. The transition edges shown in FIG. 10C are symmetrical (shown by the arrows 1025 and 1026 having the same length). The leading section 1023 and the trailing section 1024 of the rising transition edge are linear extensions of linear midsection 1021 that angularly deviate from linear midsection 1021.

FIG. 10D shows linear midsections, linear leading sections and linear trailing sections similar to the linear sections of FIG. 10C, except that, in FIG. 10D, the linear midsections are shifted relative to the intersection point 1031. For example, linear midsection 1032 is shifted towards linear leading section 1033. The transition edges shown in FIG. 10D are half symmetrical about intersection point 1031; that is, they are horizontally (i.e., magnitude-wise) symmetric but vertically (i.e., temporally) asymmetric, as shown by the arrows 1025 and 1026 differing in height. Therefore, the transition edges shown in FIG. 10D are asymmetric. For the sake of demonstration the signals, or waveforms, shown in FIGS. 10A through 10D have the same transition time (shown in FIG. 10A at 1003). However, the temporal width of a transition time (as well as the number, relative location and slope of linear segments of the transition edges) can optimally be adapted to the communication standard or protocol used. In optimizing the aforementioned factors (temporal width of a transition time, number of linear segments in a transition edge, the slew rate or slope of each segment, etc.), a tradeoff between CMI and DMI interferences may have to be considered.

As explained and demonstrated herein, each transition edge may, in general, have at least three segments, each of which having a different average slope. If a segment is linear, or mostly linear, it may be said that this segment has a certain (constant) slope (as well as an average slope), whereas if the segment is curved, it may be said that this segment has an average slope. Preferably, a midsection is linear, mostly linear, or substantially linear, and its slope is steeper than the slope, or average slope, of the associated leading section and trailing section.

Figure 11:
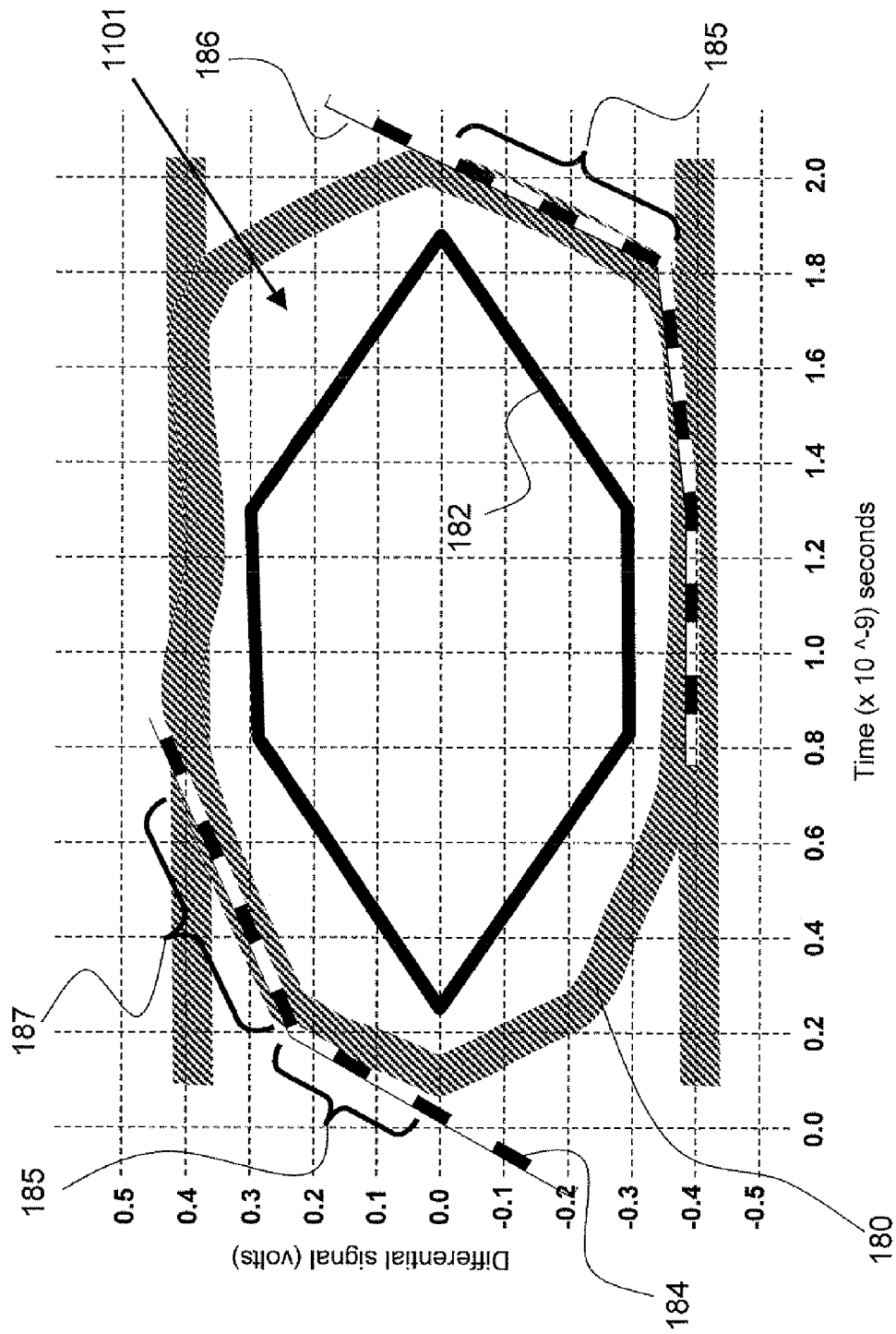
FIG. 11 depicts an eye diagram of a signal transmitted through a differential communication link according to an example embodiment of the present disclosure.

FIG. 11 shows an exemplary eye pattern that was obtained using the CMI reduction method of the present disclosure. In FIG. 11 the transition edges include two linear segments, a first substantially linear segment 185 and a second substantially linear segment 187. Substantially linear segment 185 is shown by test equipment split into two sections. When comparing the eye pattern of FIG. 11 to the eye pattern of FIG. 6 (an eye pattern obtained by using a common mode choke), it is evident that the two eye patterns are similar even though no choke is used. This means that using the methodology of the present disclosure results in an improvement in CMI interferences which is at least as good as the improvement obtained by using a common mode choke.

There are several ways to manipulate transition edges. For example, a fixed current source may simultaneously be applied to several switching transistors whose control gates are provided with control signals. Because switching transistors have inherent (i.e., parasitic) capacitances between their drain, source and gate terminals, the current that a switching transistor will output depends on the voltage that develops on these capacitances. In general (assuming a switching transistor is in conducting mode), the higher the magnitude of the current that is provided to the transistor's input terminal (i.e., source), the faster the capacitance between the transistor's source and gate is charged with electrical charge, and the faster the capacitor's voltage is elevated, which results in a faster slew rate. The more switching transistors are switched into their "on" state, the greater the accumulative capacitance and, therefore, the slower the slew rate. Therefore, it is possible to set the steepness (i.e., slope or slew rate) of each segment or section in a transition edge by deciding which switching transistor will be in which state, and at what timing. This approach is shown in, and described below in connection with, FIG. 12. In another example a single switching transistor is disposed between a common current source and one communication conductor and another single switching transistor is disposed between the common current source and the other communication conductor, and each transistor's gate is provided with a varying control signal to enforce a required switching pattern on the switching transistors. This approach is shown in, and described below in connection with, FIG. 13.

Figure 12:
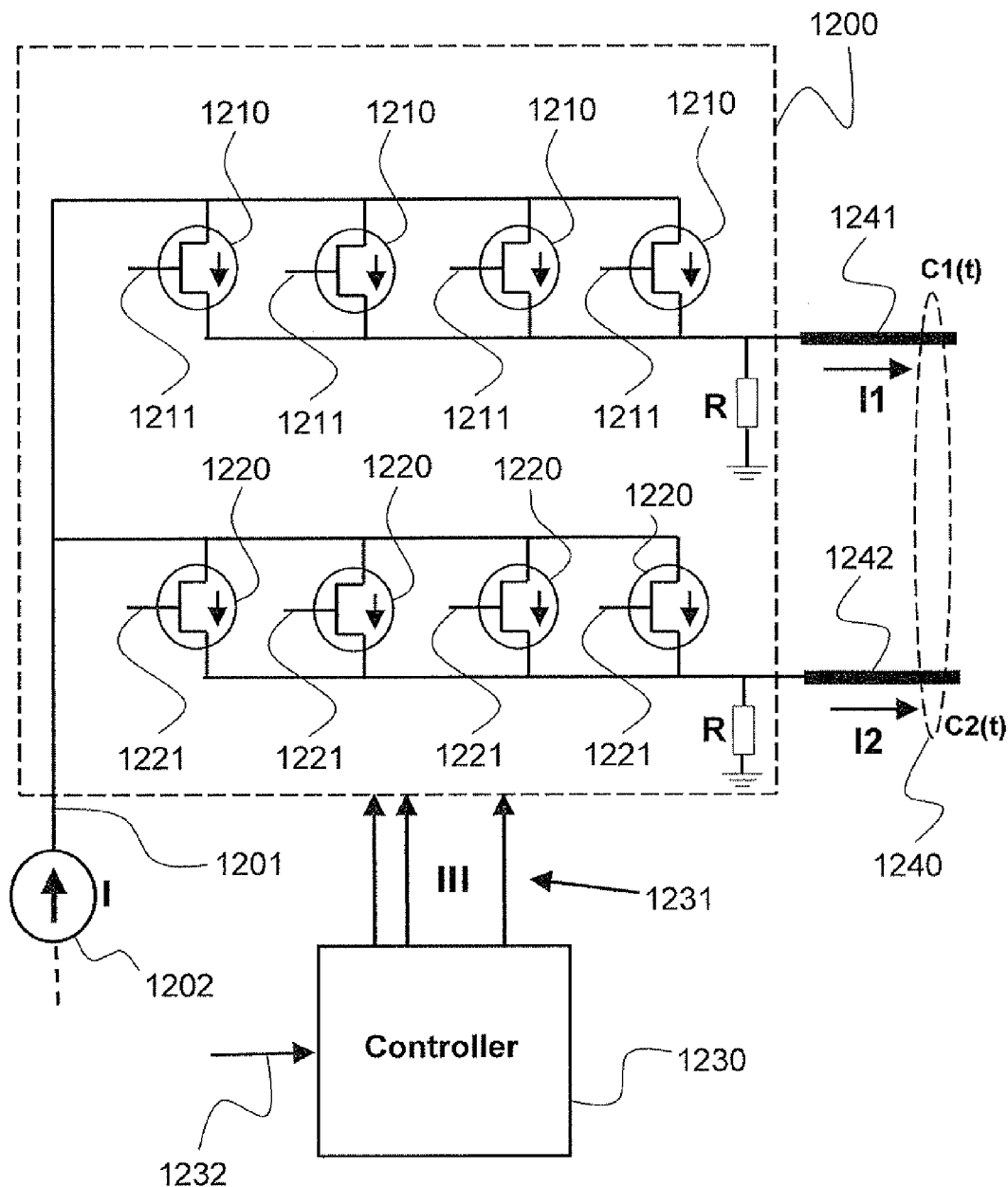
FIG. 12 schematically illustrates a switching system according to one example embodiment of the present disclosure.

FIG. 12 schematically illustrates a simplified switching system (shown at 1200) for transmitting binary digits via a differential communication channel ("DCC") according to one example embodiment of the present disclosure. Switching system 1200 is operatively interposed between current source 1202 and differential communication channel 1240.

In general, a switching system may include a first set of two or more controllable switches 1210 that are connected in parallel and interposed between a current source 1202 and a first conductor 1241, and each of the two or more controllable switches 1210 may be separately switchable, in response to one or more control signals issued by controller 1230, between a "cutoff" mode, a "linear" mode and a "saturation" mode a control signal received from a controller 1230, between a "cutoff" mode, in which mode effectively no current can flow from current source 1202 to the first conductor 1241 through the switch because the switch acts as an "open contact", a "linear" mode, in which mode the amount of current conveyed by the switch from current source 1202 to the first conductor 1241 is controllable because the switch acts as a "controllable resistance", and a "saturation" mode, in which mode the switch acts as a "closed contact" or an "electric conductor" that is interposed between current source 1202 and the first conductor 1241. Each of switches 1210 can be, at any given instant, in "cutoff" mode, in linear mode, or in "saturation" mode. The details of switching switches 1210 are discussed further below.

The switching system may also include a second set of two or more controllable switches 1220 that are connected in parallel and interposed between a current source 1202 and a second conductor 1242. Each of the two or more controllable switches 1220 is also separately switchable, in response to one or more control signals issued by controller 1230, between a "cutoff" mode, a "linear" mode and a "saturation" mode a control signal received from a controller 1230, between a "cutoff" mode, in which mode effectively no current can flow from current source 1202 to the second conductor 1242 through the switch because the switch acts as an "open contact", a "linear" mode, in which mode the amount of current conveyed by the switch from current source 1202 to the second conductor 1242 is controllable because the switch acts as a "controllable resistance", and a "saturation" mode, in which mode the switch acts as a "closed contact" or an "electric conductor" that is interposed between current source 1202 and the second conductor 1242. Each of switches 1220 can, at any given instant, be in "cutoff" mode, in linear mode, or in "saturation" mode". The details of switching switches 1220 are discussed further below. In the example arrangement shown in FIG. 12, the first set of controllable switches of switching system 1200 includes four mutually parallel switching transistors 1210 and the second set of controllable switches of switching system 1200 includes four mutually parallel switching transistors 1220.

Controller 1230 may control the first set of two or more controllable switches 1210 to produce a first composite current (shown as I1 in FIG. 12) that includes at least three segments (i.e., a leading edge, a midsection, and a trailing edge), and the second set of two or more controllable switches 1220 to produce a second composite current (shown as 12 in FIG. 12) that includes at least three like segments (i.e., a leading edge, a midsection, and a trailing edge).

The output terminal 1201 of current source 1202 is connected to the input terminals of transistors 1210. The output terminals of transistors 1210 are connected to a first conductor 1241 of the DCC 1240. The output 1201 of current source 1202 is also connected to the input terminals of a plurality of transistors 1220. The output terminals of transistors 1220 are connected to a second conductor 1242 of DCC 1240.

Transistors 1210 and 1220 may be, for example, MOSFET transistors that are formed or realized on common silicon substrate. Although FIG. 12 shows four transistors for conductor 1241 and four transistors for conductor 1242, the number of the transistor may be less than four or greater than four (i.e., per conductor 1241 and 1242). It is noted that the number of switches associated with one conductor (e.g., conductor 1241) and the number of switches associated with the other conductor (e.g., conductor 1242) does not have to be identical. In general, the more transistors are used, the more controllable are the transition edges enforced on the currents flowing through conductors 1241 and 1242 during transition times. The electrical characteristics of the multiple transistors 1210 do not have to be identical. For example, one of the transistors 1210 may be selected such that its electric current contribution to the composite current I1 provided to conductor 1241 is significantly greater than the current contribution of the other transistors 1210. Likewise, the electrical characteristics of the multiple transistors 1220 do not have to be identical.

Current source 1202 provides, at any given time, a direct current which has a fixed magnitude I. At any given time current I may either wholly flow through conductor 1241 (in which case I1=I, I2=0), or wholly flow through conductor 1242 (in which case I2=I, I1=0) or partly flow through conductors 1241 and 1242 (in which case I1>0, I2>0, I1+=I2=I), as further discussed below.

Each of transistors 1210 and 1220 (the terms "transistor" and "switch" are interchangeably used herein) has a control terminal (respectively shown at 1211 and 1221). Depending on the control signal provided to the control terminal of a transistor, the transistor can either be in "cutoff" mode, a mode in which effectively no current flows from the input terminal of the transistor to its output terminal, or in a "linear" mode, a mode in which the transistor can be used as a controllable resistance or as an amplifier, or in a "saturation" mode, a mode in which the input terminal and the output terminal of the transistor are short-circuited internally, by the transistor. In cutoff mode the resistance between the transistor's input to its output is very high (typically hundreds of mega ohms), for which reason only a negligible current may flow through the transistor. In saturation mode the transistor has a very low resistance (typically less than 1 to a few ohms) between its input and output terminals, for which reason the transistor acts as a "closed contact". In linear mode the resistance may change between these two extremes (several ohms and hundreds of mega ohms).

Assuming that the first conductor 1241 and second conductor 1242 of DCC 1240 are used to transmit binary digits "1" and "0", respectively, then in order to transmit a single binary digit "1" at least one of transistors 1210 has to be in saturation mode while, at the same time, all of transistors 1220 must be in cutoff mode to electrically isolate the second conductor 1242 of the DCC 1240 from current source 1202. In such a case, the direct current I provided by current source 1202 will be fully provided to the first conductor 1241 while no current will be provided to conductor 1242. In order to ensure that, during the transmission of a binary digit "1", the current provided to conductor 1241 has the closest possible magnitude to the magnitude of current I (it will be assumed that, in this case, I1=I), all of the transistors 1210 are switched to saturation mode to introduce to the current source 1202 the minimum possible resistance.

In order to transmit a single binary digit "0" at least one of transistors 1220 has to be in saturation mode while, at the same time, all of transistors 1210 must be in cutoff mode to electrically isolate the first conductor 1241 of the DCC 1240 from current source 1202. In such a case, the direct current provided by current source 1202 will be fully provided to the second conductor 1242 while no current will be provided to conductor 1241. As was the case for the transmission of a single binary digit "1", so too in order to ensure that during the transmission of a binary digit "0" the current provided to conductor 1242 has the closest possible magnitude to the magnitude of current I (it will be assumed that, in this case, I2=I), all of transistors 1220 are switched to saturation mode to introduce to the current source 1202 the minimum possible resistance.

Controller 1230 is operative to control switching system 1200 to connect the current source 1202 only to the first conductor 1241 during the transmission of a specific binary digit, and to connect current source 1202 only to the second conductor 1242 during the transmission of a different binary digit.

Controller 1230 is also operative to control switching system 1200 to decrease from a maximum value to zero the amount of current provided to one of the two conductors 1241 and 1242 and to increase from zero to a maximum value the amount of current provided by the current source to the other of the two conductors 1241 and 1242, while transitioning current source 1202 from being connected to the one conductor (e.g., from being connected to conductor 1241) to being connected to the other conductor (e.g., from being connected to conductor 1242). In this case, each of the currents (that is, the current provided to the one conductor whose amount is decreasing, and the current provided to the other conductor whose amount is increasing) has a transition edge that has, or includes, at least three segments, as illustrated, for example, in FIG. 10D, and decreasing the current provided to the one conductor and increasing the current provided to the other conductor is controlled by controller 1230 to occur simultaneously and at the same rate.

Controller 1230 controls the switching sequence of switches 1210 and 1220 by applying corresponding control signals to control inputs 1211 and 1221 of transistors 1210 and 1220, respectively. Controller 1230 has output terminals 1231, each of which is uniquely connected either to one of the control terminals 1211, or to one of the control terminals 1221. The number of output terminals 1231 is unspecified in FIG. 12, but may be equal to or greater than the total number of transistors 1210 and 1220. In operation, controller 1230 schedules a switching sequence and outputs control signals to output terminals 1231 to force on each transistor 1210 and 1220 a desired mode (i.e., "cutoff" mode, "linear" mode, or "saturation" mode).

Upon receiving a command (shown at 1232) to change the transmitted binary digit, controller 1230 employs, during a transition time, a first switching sequence on switches 1210 to provide a first composite current I1 to conductor 1241, whose transition edge resembles a transition edge that is shown, for example, in FIG. 8 or in FIG. 9, or in any of FIGS. 10B through 10D, rather than an exponential-like transition edge. During the transition time, controller 1230 also employs a second switching sequence on switches 1220 to provide a second composite current I2 to conductor 1242. Because both I1 and I2 are provided by the same current source (i.e., current source 1202), I1+I2=I at any given time, including during transition times.

If, for example, the transmitted binary digit should change from "1" to "0", the current provided to conductor 1241 (i.e., I1) must have a falling transition edge. To accomplish that (assuming that transistors 1210 are all in saturation mode during the transmission of the binary digit "1"), controller 1230 may first force one of transistors 1210 to be in its linear mode and manipulate the transistor's resistance to gradually reduce the value of current I1 flowing through conductor 1241, and, after some delay, switch a second transistor 1210 into its cutoff mode and the remaining two transistors 1210 into cutoff mode to cause an abrupt linear reduction in I1. Then, controller 1230 may switch one more of transistors 1210 into linear mode to gradually reduce I1 to zero.

It is noted that simultaneously with the operation of transistors 1210 controller 1230 may control matching transistor(s) 1220 to obtain the opposite effect. For example if controller 1230 operates the leftmost transistor 1210 through its linear mode to gradually reduce I1, controller 1230, at the same time, may operate the leftmost transistor 1220 through its linear mode to gradually increase I2 to maintain the I1+I2=I constraint. Of course, if the transmitted binary digit is to be changed (e.g., from "0" to "1") the controller may perform an analogous sequence of actions on the transistors to accomplish this. It is noted that the transition from transmission of a given binary digit to transmission of the other binary digit may be accomplished by other switching sequences implemented by controller 1230. An example of such another sequence is discussed below.

Controller 1230 operates switches 1210 and 1220 in such a manner as to achieve the desired transition edges. For example, the leading edges and trailing edges of I1 and I2 may be made curved by gradually reducing or increasing (as the case may be) the current through some of switches 1210 and some of switches 1220. However, the leading edges (for example) of I1 and I2 can be made linear by switching one of switches 1210 into cutoff mode and another one of switches 1210 into saturation mode (instead of switching both of them into linear mode). In order to impart the desired steepness to selected segments of a transition edge, two or more of the switches associated with the transition edge may simultaneously be switched from saturation mode to cutoff mode or from cutoff mode to saturation mode, depending on whether that particular transition edge is a falling transition edge or a rising transition edge. For example, if the current passing through conductor 1241 should have a falling transition edge, two of transistors 1210 can simultaneously be switched from saturation mode into cutoff mode, while, at the same time, the two matching ones of transistors 1220 are switched from cutoff mode into saturation mode. This way, the amount of current that ceases flowing through conductor 1241 will now flow through conductor 1242. In general the greater the number of transistors associated with one conductor (e.g., conductor 1241) that are switched simultaneously from saturation mode into cutoff mode, while the matching transistors associated with the other conductor (e.g., conductor 1242) are switched simultaneously from cutoff mode into saturation mode, the steeper the segment within the involved transition edge. Control signals 1231 may be digital signals or analog signals.

Figure 13:
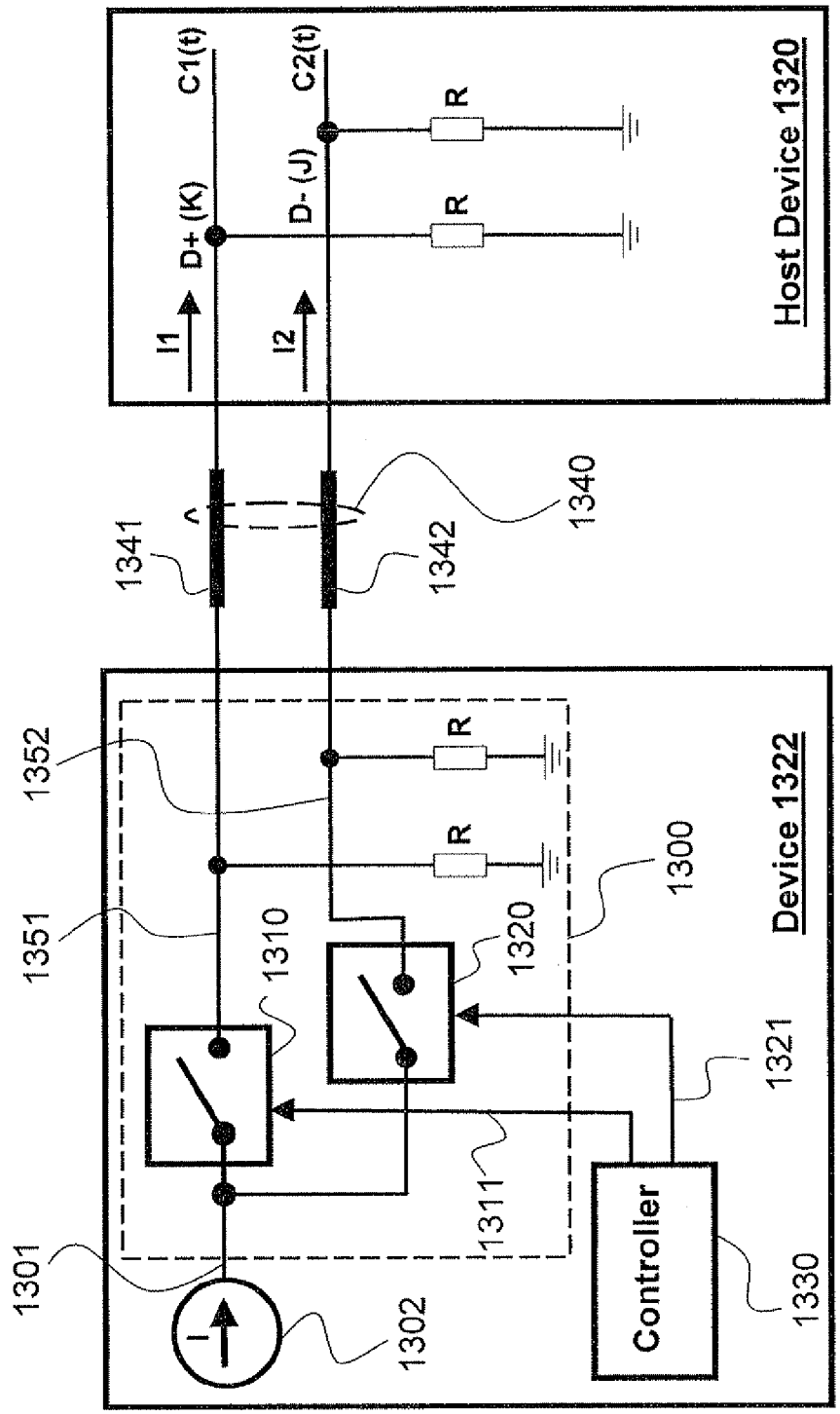
FIG. 13 schematically illustrates a switching system according to another example embodiment of the present disclosure.

FIG. 13 schematically illustrates a simplified switching system (shown at 1300) for transmitting binary digits via a DCC according to another example embodiment of the present disclosure. Switching system 1300 is operatively interposed between current source 1302 and differential communication channel 1340. The output terminal 1301 of current source 1302 is connected to the input terminals of switches 1310 and 1320. The output terminal 1351 of switch 1310 and the output terminal 1352 of switch 1320 are respectively connected to a first conductor 1341 and to a second conductor 1342 of DCC 1340. Switches 1310 and 1320 are MOSFET switches and the desired linear one or more segments of the transition edges of I1 and I2 (or of C1(t) and C2(t)), during transition times, are obtained by modulating the gate (C) voltage of MOSFET switches 1310 and 1320, the gates of MOSFET switches 1310 and 1320 being respectively shown at 1311 and 1321. By modulating the gate voltage of MOSFET switches 1310 and 1320 is meant switching switches 1310 and 1320 "on" and "off" (i.e., between cutoff mode and saturation mode), and also exploiting their linear mode. In particular, controlling the switching pattern of the involved switches is effected by changing the current "injected" to the transistor's parasitic capacitor. As explained above, the higher the current provided to the transistor's gate (and therefore to the parasitic capacitor), the faster that capacitor will be charged with electrical charge and the faster the slew rate will be. MOSFET switches 1310 and 1320 are driven by modulating signals that are respectively provided to gates 1311 and 1321 by controller 1330.

In a prior art switching system such as the switching system 102 of FIG. 1, the switches would only be switched between "on" (saturated mode) and "off" (cutoff mode), without controlling the behavior of the transition edges. However, using a controller such as controller 1230 of FIG. 12 or controller 1330 of FIG. 13, switches will be switched between on and off and their linear mode will be exploited to segment the falling and rising transition edges of the signals fed to the DCC.

Controllers 1230 and 1330, switching systems 1200 and 1300, current sources 1202 and 1302, and differential communication channels 1240 and 1340 may be implemented in any ways known in the art, as will be understood by those of ordinary skill in the art. For example, controllers 1230 and 1330 may be implemented in hardware, software, firmware or any combination of these.

The inventor of the present disclosure used another simulation tool, the "MATLAB", to see how CMI can be significantly reduced using C1($t$) and C2($t$) that have ternary (i.e., three-part) transition edges. MATLAB is a numerical computing environment and programming language created by the MathWorks, Inc. MATLAB allows easy matrix manipulation, implementation of algorithms, etc.

Figure 14:
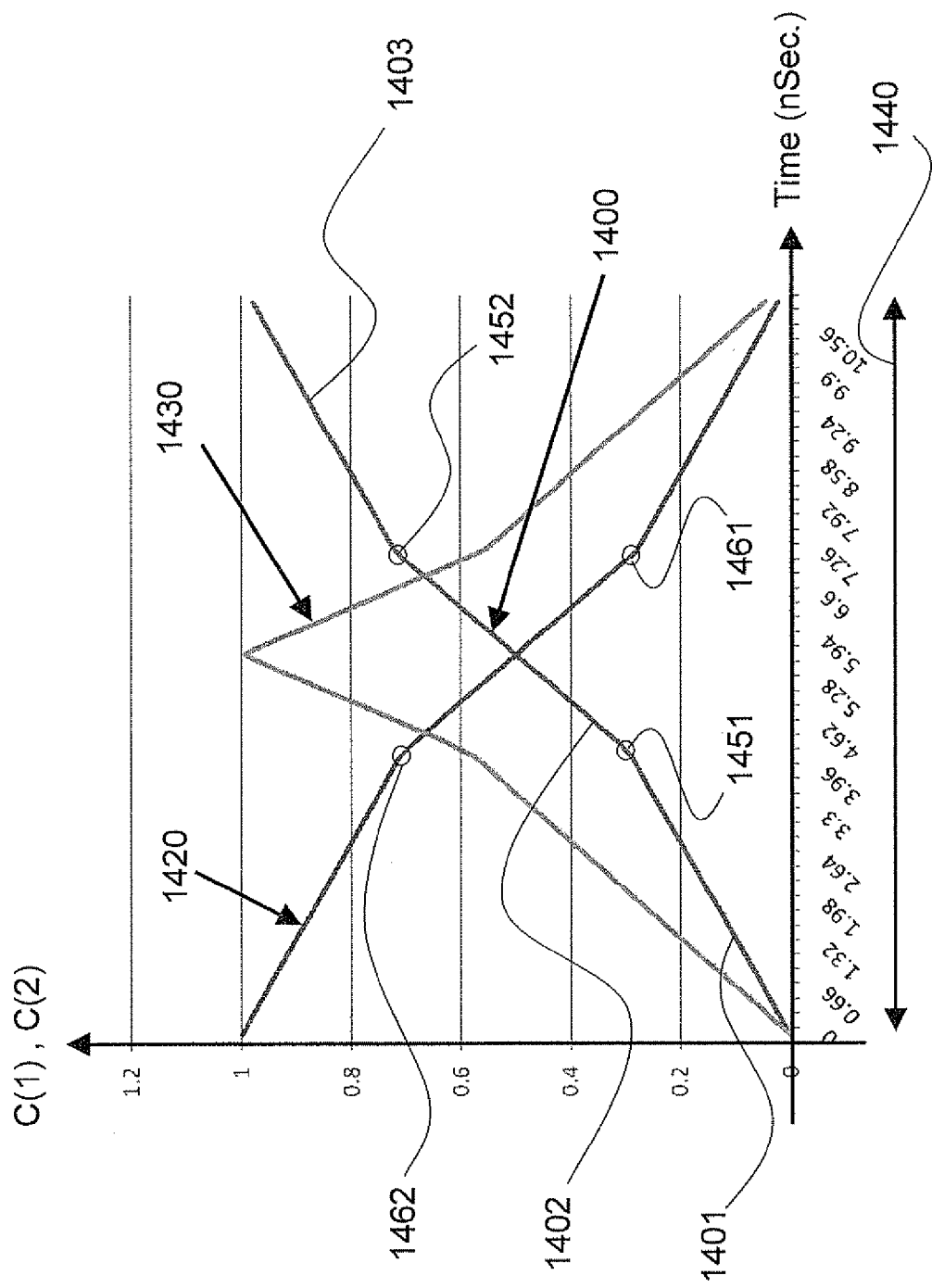
FIG. 14 shows simulation results that are associated with symmetrically segmented transition curves according to an example embodiment of the present disclosure.
Figure 15:
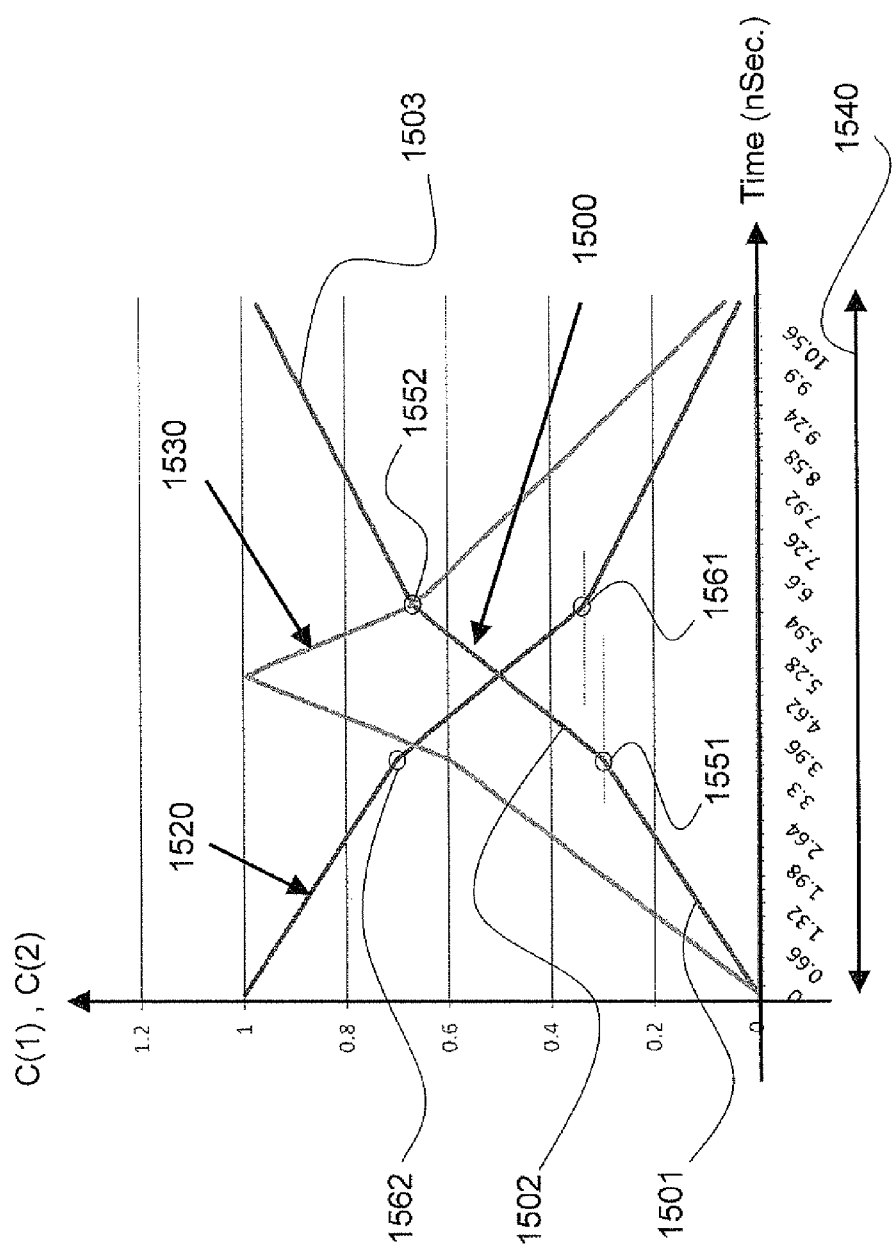
FIG. 15 shows simulation results that are associated with asymmetrically segmented transition curves according to another example embodiment of the present disclosure.
Figure 16:
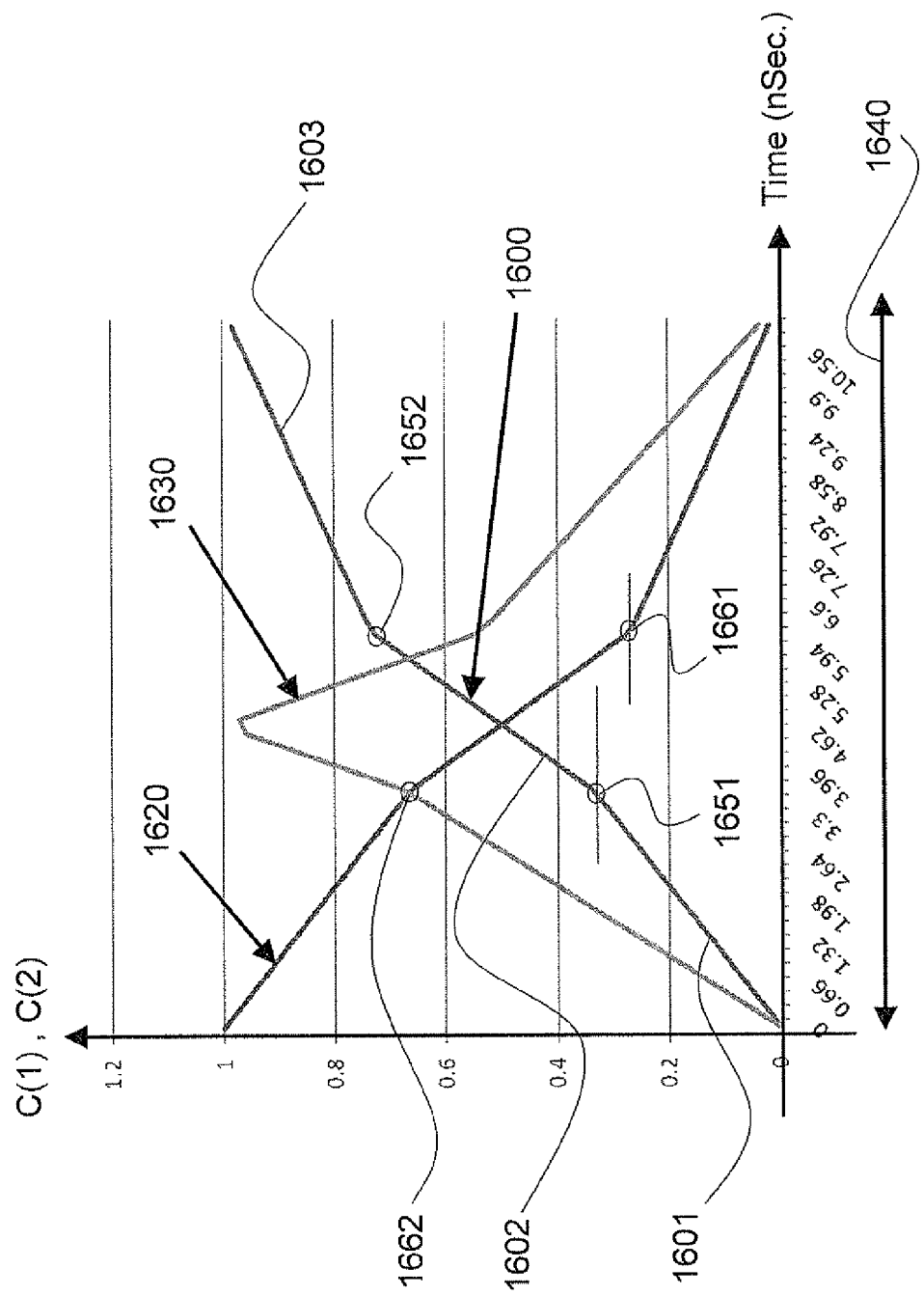
FIG. 16 shows simulation results that are associated with symmetrically segmented transition curves according to yet another example embodiment of the present disclosure.

For the purpose of simulation the slopes of leading edges, midsections, and trailing sections of transition edges were changed and "Z" values (see formula (3)) were calculated for the different slopes. FIGS. 14, 15, and 16, which are described below, depict three exemplary simulation diagrams that were obtained by using MATLAB. The inventor of the present invention has found that Z values are low for transition edges that comply with two criteria: (i) the lower endpoint of the midsection of the transition edge occurs at a point on the y axis (FIGS. 14-16) that is higher (greater) than 20% of the magnitude of the signal in question (e.g., C1($t$)) and the higher endpoint of that midsection occurs at a point on the y axis that is lower (less) than 80% of the magnitude of that signal, and (ii) the slope of the midsection is greater than the average slope of the leading edge and is greater than the average slope of the trailing edge (this criterion has already been discussed above). The inventor of the present invention has found that the "Z" values are the lowest if the two criteria mentioned above are met and, in addition, the slope of the midsection of the transition edge is less than 0.227 and the slope of each of the leading and trailing edges of the transition edge is between 0.0909 and 0.06. The transition edges shown in FIGS. 14 through 16 exemplify the criteria mentioned above. It should be note that because the simulations illustrated in FIGS. 14-16 were made using MATLAB, while those illustrated in FIGS. 8 and 9 were made using Microsoft Excel, the Z values for the former (MATLAB simulations) are not directly comparable with the Z values for the latter (Microsoft Excel simulations).

FIG. 14 shows simulation results that are associated with symmetrically segmented transition edges according to an example embodiment of the present disclosure. The transition edge of C1($t$) (C1($t$) is shown at 1400) includes a linear leading section 1401 whose slope (i.e., slew rate) was set to 0.069, a linear midsection 1402 whose slew rate was set to 0.142, and a linear trailing section 1403 whose slew rate was identical (i.e., 0.069) to the slope of linear leading section 1401. Because C1($t$) and C(2) are always magnitude-wise symmetric, the transition edge of C2($t$) 1420 includes sections with like slopes.

C1($t$) 1400 and C2($t$) (shown at 1420) each has a midsection's low endpoint and a midsection's high endpoint. C1($t$) 1400 has a midsection's low endpoint 1451 and a midsection's high endpoint 1452. C2($t$) 1420 has a midsection's low endpoint 1461 and a midsection's high endpoint 1462. Midsection's low endpoint 1451 of C1($t$) 1400 and midsection's low endpoint 1461 of C2($t$) 1420 have substantially the same value (~0.3), and midsection's high endpoint 1452 of C1($t$) 1400 and midsection's high endpoint 1462 of C2($t$) 1420 have substantially the same value (~0.7). Therefore, C0($t$) 1400, C2($t$) 1420, and therefore F(t) 1430, are temporally symmetrical. C1($t$) 1400 and C2($t$) 1420 are symmetrical in another sense: the slope of the leading edge 1401 and the slope of the trailing edge 1403 are identical (i.e., 0.09). Applying formula (3) to C1($t$) 1400 and C2($t$) 1420 to calculate the area under F(t) 1430 over one transition period 1440 yields Z=4.31.

FIG. 15 shows simulation results that are associated with asymmetrically segmented transition edges according to another example embodiment of the present disclosure. The transition edge of C0($t$) (C1($t$) shown at 1500) includes a linear leading section 1501 whose slope (i.e., slew rate) was set to 0.08, a linear midsection 1502 whose slew rate has been chosen to be 0.15, and a linear trailing section 1503 whose slew rate was set to 0.06. Because C1($t$) and C(2) are always magnitude-wise symmetric, the transition edge of C2($t$) 1520 includes sections with like slopes.

Each of C1($t$) 1500 and C2($t$) (shown at 1520) has a midsection's low endpoint and a midsection's high endpoint. C1($t$) 1500 has a midsection's low endpoint 1551 and a midsection's high endpoint 1552. C2($t$) 1520 has a midsection's low endpoint 1561 and a midsection's high endpoint 1562. Midsection's low endpoint 1551 of C1($t$) 1500 and midsection's low endpoint 1561 of C2($t$) 1520 have different values (~0.3 vs. ~0.35), and midsection's high endpoint 1552 of C1($t$) 1500 and midsection's high endpoint 1562 of C2($t$) 1520 also have different values (~0.7 vs. ~0.65). Therefore, C1($t$) 1500, C2($t$) 1520, and therefore F(t) 1530, are temporally asymmetrical. C1($t$) 1500 and C2($t$) 1520 are asymmetrical in another sense because, unlike FIG. 14, in FIG. 15 the linear leading section 1501 and the linear trailing section 1503 have different slew rates (0.08 and 0.06, respectively). Applying formula (3) to C1($t$) 1500 and C2($t$) 1520 to calculate the area under F(t) 1530 over one transition period 1540 yields Z=4.42.

FIG. 16 shows simulation results that are associated with asymmetrically segmented transition edges according to yet another example embodiment of the present disclosure. The transition edge of C1($t$) (C1($t$) shown at 1600) includes a linear leading section 1601 whose slope (i.e., slew rate) was set to 0.09, a linear midsection 1602 whose slew rate has been chosen to be 0.16, and a linear trailing section 1603 whose slew rate was set to 0.05. Because C1($t$) and C(2) are always magnitude-wise symmetric, the transition edge of C2($t$) 1620 includes sections with like slopes.

C1($t$) 1600 and C2($t$) (shown at 1620) each has a midsection's low endpoint and a midsection's high endpoint. C1($t$) 1600 has a midsection's low endpoint 1651 and a midsection's high endpoint 1652. C2($t$) 1620 has a midsection's low endpoint 1661 and a midsection's high endpoint 1662. Midsection's low endpoint 1651 of C1($t$) 1600 and midsection's low endpoint 1661 of C2($t$) 1620 have different values (above 0.3 vs. below 0.3), and midsection's high endpoint 1652 of C1($t$) 1600 and midsection's high endpoint 1662 of C2($t$) 1620 also have different values (above 0.7 vs. below 0.7). Therefore, C1($t$) 1600, C2($t$) 1620, and therefore F(t) 1630, are temporally asymmetrical. C1($t$) 1600 and C2($t$) 1620 are asymmetrical in another sense because, like FIG. 15, in FIG. 16 the linear leading section 1601 and the linear trailing section 1603 have different slew rates (0.09 and 0.05, respectively). Applying formula (3) to C1($t$) 1600 and C2($t$) 1620 to calculate the area under F(t) 1630 over one transition period 1640 yields Z=4.17. FIGS. 8, 9, and 14 through 16, show that the value of "Z" (and therefore the CMI) can be reduced by manipulating the slopes of selected segments of transition edges.

In the description and claims of the present application, each of the verbs, "comprise", "include" and "have", and conjugates thereof, are used to indicate that the object or objects of the verb are not necessarily a complete listing of members, components, elements, or parts of the subject or subjects of the verb.

The articles "a" and "an" are used herein to refer to one or to more than one (i.e., to at least one) of the grammatical object of the article, depending on the context. By way of example, depending on the context, "an element" can mean one element or more than one element.

The term "including" is used herein to mean, and is used interchangeably with, the phrase "including but not limited to".

The terms "or" and "and" are used herein to mean, and are used interchangeably with, the term "and/or," unless context clearly indicates otherwise.

The term "such as" is used herein to mean, and is used interchangeably, with the phrase "such as but not limited to".

Having thus described exemplary embodiments of the invention, it will be apparent to those skilled in the art that modifications of the disclosed embodiments will be within the scope of the invention. Alternative embodiments may, accordingly, include more modules, less modules, and/or functionally equivalent modules. For example, transition edges may include less than three segments or more than three segments, and every segment, or selected segments, may be linear. The present disclosure is relevant, mutatis mutandis, to various types of differential communication channels.

What is claimed is:

1. A method of transmitting one binary digit at a time via a differential communication channel having a first conductor and a second conductor, the method comprising:
    A) providing, by a current source, a current to the first conductor while isolating the second conductor from the current source, to thereby transmit a first binary digit; and,
    B) responsive to a command to transmit a second binary digit, (i) decreasing from a maximum value to zero an amount of the current provided to the first conductor and (ii) increasing from zero to a maximum value an amount of the current provided by the current source to the second conductor,
        wherein the decreasing and the increasing are performed (a) simultaneously, (b) in such a manner that the amount of the current provided to the first conductor decreases at a same rate as the amount of the current provided to the second conductor increases, and (c) in such a manner that each of a first signal corresponding to the current provided to the first conductor and a second signal corresponding to the current provided to the second conductor has a transition edge having a leading section, a midsection and a trailing section, with the midsection of the transition edge having an average slope that is greater than an average slope of the leading section of the transition edge and that is greater than an average slope of the trailing section of the transition edge and wherein the decreasing and the increasing is performed through control signals to change controllable switches from one signaling mode to another signaling mode so as to produce composite current that correspond to the transition edges associated with the respective first and second signals through the issued control signals.

2. The method according to claim 1, wherein the transition edge of the first signal and the transition edge of the second signal intersect at an intersection point and are symmetric about the intersection point.

3. The method according to claim 1, wherein the transition edge of the first signal and the transition edge of the second signal intersect at an intersection point and are asymmetric about the intersection point.

4. The method according to claim 1, wherein a magnitude of the first signal at a lower endpoint of the midsection of the transition edge thereof is greater than 20 percent of the maximum value of the first signal, and a magnitude of the first signal at a higher endpoint of the midsection of the transition edge thereof is less than 80 percent of the maximum value of the first signal, and wherein a magnitude of the second signal at a lower endpoint of the midsection of the transition edge thereof is greater than 20 percent of the maximum value of the second signal, and a magnitude of the second signal at a higher endpoint of the midsection of the transition edge thereof is less than 80 percent of the maximum value of the second signal.

5. The method according to claim 1, wherein, for each of the transition edges, the midsection thereof is at least substantially linear.

6. The method according to claim 1, wherein each of the transition edges has a temporal duration complying with the universal bus protocol.

7. The method according to claim 1, wherein, for each of the transition edges, the average slope of the midsection thereof is less than 0.227, the average slope of the leading section thereof is between 0.06 and 0.0909, and the average slope of the trailing section thereof is between 0.06 and 0.0909.

8. A system for transmitting digital data, one binary digit at a time, via a differential communication channel, the system comprising:
    A) a switching system operatively interposed between a current source and a differential communication channel, the differential communication channel including a first conductor and a second conductor; and
    B) a controller operative to issue control signals to said switching system:
        i. to connect the current source only to the first conductor during transmission of a first binary digit, and to connect the current source only to the second conductor during transmission of a second, different binary digit; and,
        ii. while the current source is being disconnected from the first conductor and connected to the second conductor, to (a) decrease from a maximum value to zero an amount of current provided by the current source to the first conductor and (b) increase from zero to a maximum value an amount of current provided by the current source to the second conductor,
    wherein the controller is operative to issue the control signals in such a manner that (1) the decreasing and the increasing are performed simultaneously, (2) the amount of the current provided to the first conductor decreases at a same rate as the amount of the current provided to the second conductor increases, and (3) each of a first signal corresponding to the current provided to the first conductor and a second signal corresponding to the current provided to the second conductor has a transition edge having a leading section, a midsection and a trialing section, with the midsection of the transition edge having an average slope that is greater than an average slope of the leading section of the transition edge and that is greater than an average slope of the trailing section of the transition edge, and wherein the switching system includes, a first controllable switch interposed between the current source and the first conductor; and a second controllable switch interposed between the current source and the second conductor, wherein said controller controls, via the issued control signals, the first controllable switch to produce a composite current corresponding to the transition edge associated with the first signal, and the second controllable switch to produce a composite current corresponding to the transition edge associated with the second signal.

9. The system according to claim 8, wherein the transition edge of the first signal and the transition edge of the second signal intersect at an intersection point and are symmetric about the intersection point.

10. The system according to claim 8, wherein the transition edge of the first signal and the transition edge of the second signal intersect at an intersection point and are asymmetric about the intersection point.

11. The system according to claim 8, wherein a magnitude of the first signal at a lower endpoint of the midsection of the transition edge thereof is greater than 20 percent of the maximum value of the first signal, and a magnitude of the first signal at a higher endpoint of the midsection of the transition edge thereof is less than 80 percent of the maximum value of the first signal, and wherein a magnitude of the second signal at a lower endpoint of the midsection of the transition edge thereof is greater than 20 percent of the maximum value of the second signal, and a magnitude of the second signal at a higher endpoint of the midsection of the transition edge thereof is less than 80 percent of the maximum value of the second signal.

12. The system according to claim 8, wherein, for each of the transition edges, the average slope of the midsection thereof is less than 0.227, the average slope of the leading section thereof is between 0.06 and 0.0909, and the average slope of the trailing section thereof is between 0.06 and 0.0909.

13. The system according to claim 8, wherein each of the transition edges has a duration complying with the universal bus protocol.

14. A system for transmitting digital data, one binary digit at a time, via a differential communication channel, the system comprising:

A) a switching system operatively interposed between a current source and a differential communication channel, the differential communication channel including a first conductor and a second conductor; and B) a controller operative to issue control signals to said switching system:

a. to connect the current source only to the first conductor during transmission of a first binary digit, and to connect the current source only to the second conductor during transmission of a second, different binary digit; and, b. while the current source is being disconnected from the first conductor and connected to the second conductor, to (a) decrease from a maximum value to zero an amount of current provided by the current source to the first conductor and (b) increase from zero to a maximum value an amount of current provided by the current source to the second conductor, wherein the controller is operative to issue the control signals in such a manner that (1) the decreasing and the increasing are performed simultaneously, (2) the amount of the current provided to the first conductor decreases at a same rate as the amount of the current provided to the second conductor increases, and (3) each of a first signal corresponding to the current provided to the first conductor and a second signal corresponding to the current provided to the second conductor has a transition edge having a leading section, a midsection and a trialing section, with the midsection of the transition edge having an average slope that is greater than an average slope of the leading section of the transition edge and that is greater than an average slope of the trailing section of the transition edge, wherein the switching system comprises:

a first set of two or more controllable switches connected in parallel and interposed between the current source and the first conductor, each of the two or more controllable switches is independently changeable, in response to one or more of the control signals issued by said controller, between a "cutoff" mode, a "linear" mode and a "saturation" mode; and a second set of two or more controllable switches connected in parallel and interposed between the current source and the second conductor, each of the two or more controllable switches is independently changeable, in response to one or more of the control signals issued by said controller, between a "cutoff" mode, a "linear" mode and a "saturation" mode, wherein said controller controls, via the issued control signals, the first set of two or more controllable switches to produce a composite current corresponding to the transition edge associated with the first signal, and the second set of two or more controllable switches to produce a composite current corresponding to the transition edge associated with the second signal.

15. The system according to claim 14, wherein for each of the first set of two or more controllable switches and the second set of two or more controllable switches, at least one of the controllable switches is selectively operated in a cutoff mode, at least one of the controllable switches is selectively operated in a saturation mode, and at least one of the controllable switches is selectively operated in a linear mode.

16. The system according to claim 8, wherein the first controllable switch and the second controllable switch are selectively operated in a cutoff mode, a saturation mode, or in a linear mode.

17. The system according to claim 8, wherein the controllable switches are independently changeable based on the control signals issued by the controller.

* * * * *